(12) United States Patent
Lee et al.

(10) Patent No.: US 12,322,464 B2
(45) Date of Patent: Jun. 3, 2025

(54) DATA STORAGE DEVICE FOR CHECKING A DEFECT OF ROW LINES AND AN OPERATION METHOD THEREOF

(71) Applicant: SAMSUNG ELECTRONICS CO., LTD., Suwon-si (KR)

(72) Inventors: Kyungduk Lee, Suwon-si (KR); Ho-Sung Ahn, Suwon-si (KR); Youn-Soo Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/132,472

(22) Filed: Apr. 10, 2023

(65) Prior Publication Data

US 2023/0402120 A1     Dec. 14, 2023

(30) Foreign Application Priority Data

Jun. 14, 2022    (KR) .................. 10-2022-0072324

(51) Int. Cl.
*G11C 29/02*     (2006.01)
*G11C 29/52*     (2006.01)

(52) U.S. Cl.
CPC ............ *G11C 29/022* (2013.01); *G11C 29/52* (2013.01)

(58) Field of Classification Search
CPC .............................. G11C 29/022; G11C 29/52
USPC ........................................................ 365/185.09
See application file for complete search history.

(56) References Cited

U.S. PATENT DOCUMENTS

| | | | |
|---|---|---|---|
| 8,379,454 B2 | 2/2013 | Kochar et al. | |
| 9,224,495 B2 | 12/2015 | Jung et al. | |
| 9,570,177 B2 | 2/2017 | Choi | |
| 9,842,659 B2 | 12/2017 | Nam et al. | |
| 9,852,796 B2 | 12/2017 | Jung et al. | |
| 10,229,751 B2 | 3/2019 | Avraham et al. | |
| 10,854,250 B2 | 12/2020 | Lee et al. | |
| 11,232,845 B2 | 1/2022 | Yoon et al. | |
| 2014/0160847 A1 | 6/2014 | Kwak | |
| 2019/0138414 A1* | 5/2019 | Shim ................. | G11C 16/0483 |

\* cited by examiner

*Primary Examiner* — Huan Hoang
(74) *Attorney, Agent, or Firm* — MORGAN, LEWIS & BOCKIUS LLP

(57) ABSTRACT

A data storage device including: a memory device including a plurality of memory blocks; and a memory controller configured to control the memory device, wherein the plurality of memory blocks are connected with row lines, wherein the row lines include word lines, wherein the memory controller is further configured to: check whether a resistive defect occurs at the row lines except for the word lines; and set a program operation time of a memory block corresponding to a row line, at which the resistive defect occurs, to be longer than a program operation time of the other memory blocks.

19 Claims, 27 Drawing Sheets

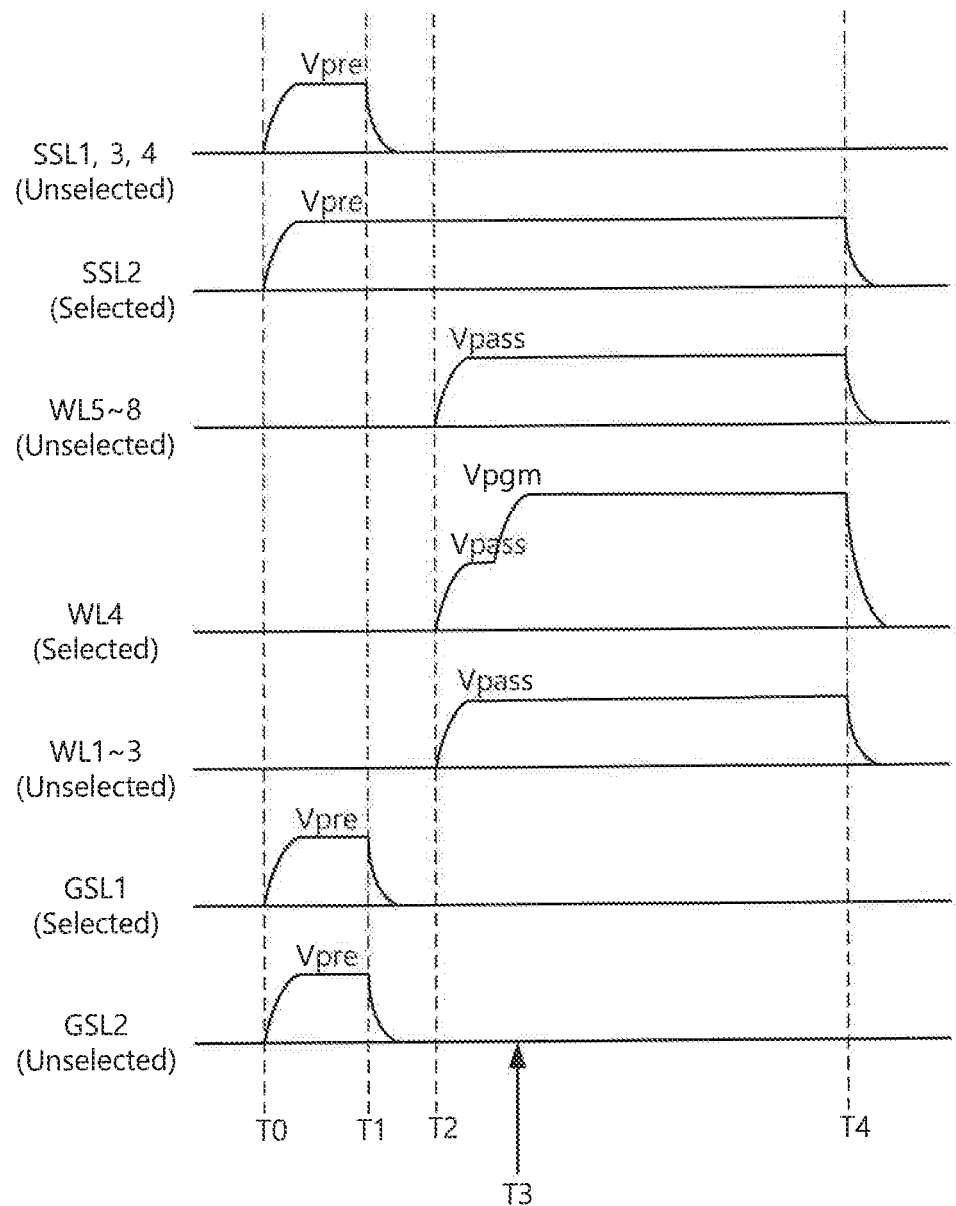

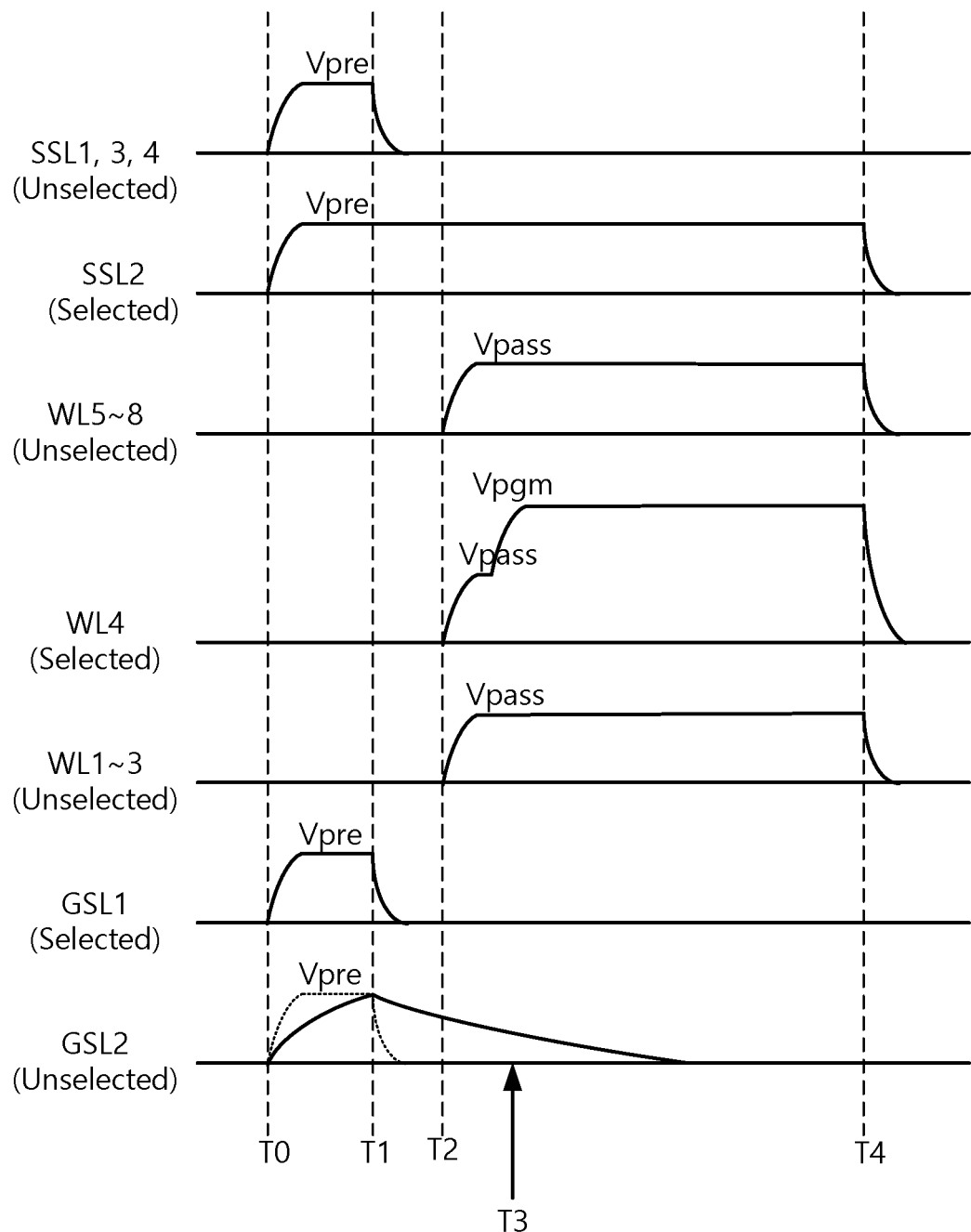

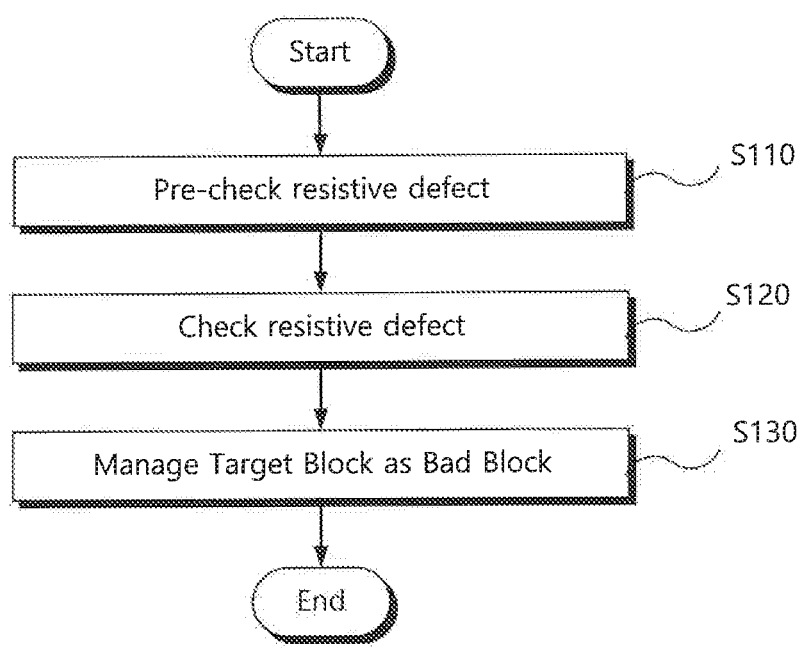

FIG.7B

| BLK | Error bit | |
|---|---|---|
| BLK1 | 10 | |
| BLK2 | 200 | ← Target Block |
| BLK3 | 20 | |
| BLK4 | 10 | |
| BLK5 | 20 | |

FIG.7C

| BLK | Page | Error bit | |
|---|---|---|---|
| BLK1 | Page1 | 20 | |
| | Page2 | 10 | |
| | ⋮ | ⋮ | |
| BLK2 | Page1 | 50 | |
| | Page2 | 200 | ← Target Page |
| | ⋮ | ⋮ | |

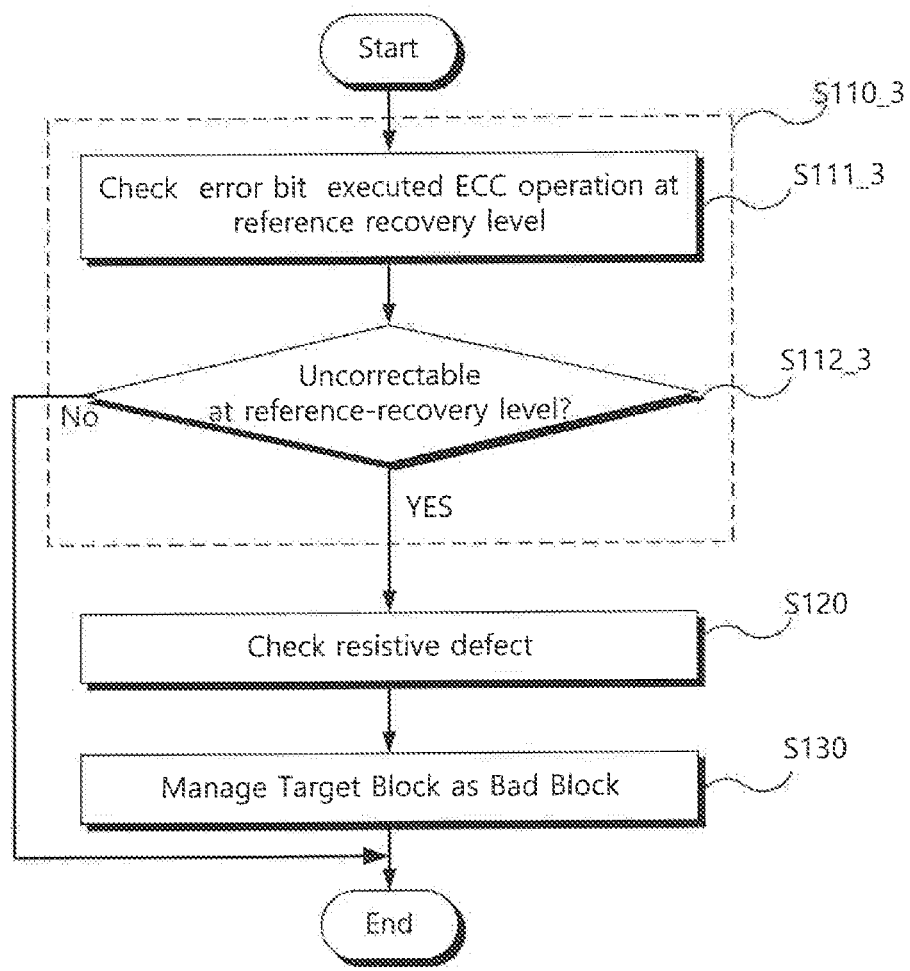

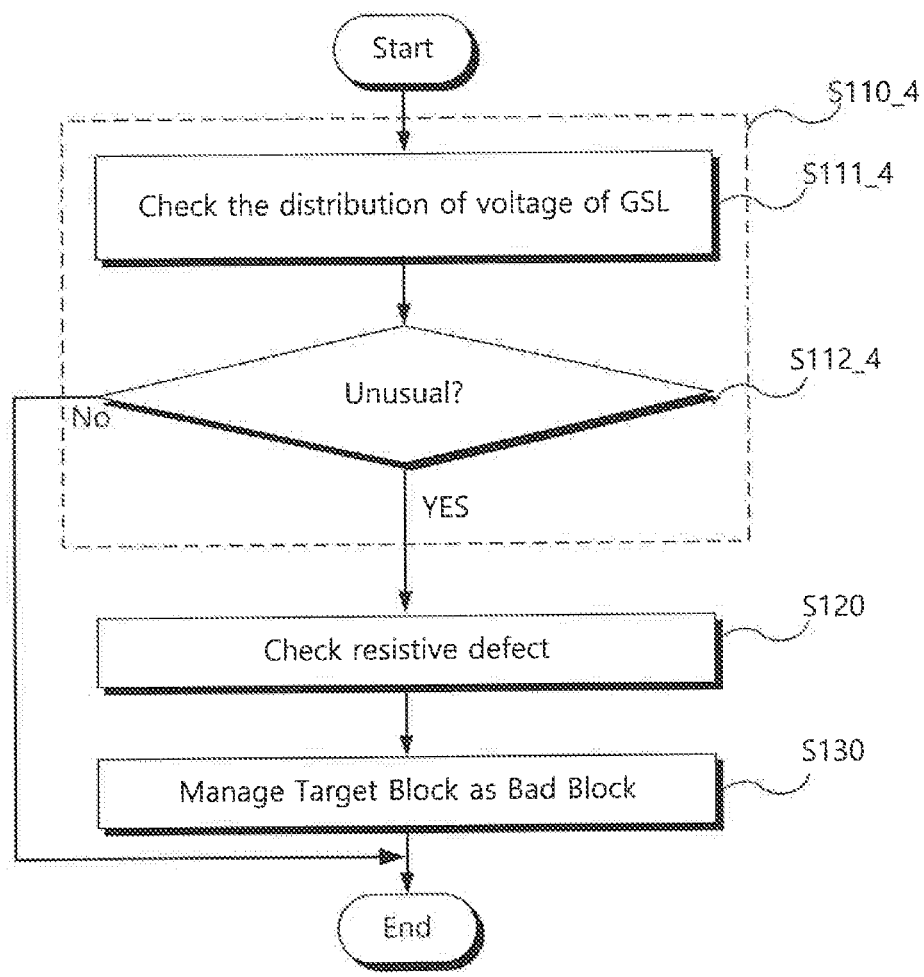

Bad Block Table

| ADDR | Invalid Mark |
|------|--------------|
| BLK1 | Valid |
| BLK2 | Invalid |
| BLK3 | Valid |
| BLK4 | Valid |
| BLK5 | Valid |

FIG.13B

Bad Block Table

| ADDR | | Invalid Mark |
|---|---|---|
| BLK1 | STR1 | Valid |
| | STR2 | Valid |
| | STR3 | Valid |
| | STR4 | Valid |
| BLK2 | STR1 | Valid |
| | STR2 | Valid |
| | STR3 | Invalid |
| | STR4 | Invalid |

DATA STORAGE DEVICE FOR CHECKING A DEFECT OF ROW LINES AND AN OPERATION METHOD THEREOF

CROSS-REFERENCE TO RELATED APPLICATION

This application claims priority under 35 U.S.C. § 119 to Korean Patent Application No. 10-2022-0072324 filed on Jun. 14, 2022, in the Korean Intellectual Property Office, the disclosure of which is incorporated by reference herein in its entirety.

TECHNICAL FIELD

Embodiments of the present disclosure described herein relate to a data storage device, and more particularly, to a data storage device capable of checking a defect that occurs at a row line.

DISCUSSION OF RELATED ART

A semiconductor memory refers to a memory device that is implemented by using a semiconductor such as silicon (Si), germanium (Ge), gallium arsenide (GaAs), or indium phosphide (InP). A semiconductor memory device is classified as a volatile memory device or a nonvolatile memory device. A volatile memory device loses its stored data in the absence of power, while the nonvolatile memory device retains its stored data even when not powered.

The characteristics of the semiconductor memory device may change due to various factors such as its operating environment, the number of times it is used, and its overall usage time, thereby causing the reliability of the semiconductor memory device to drop. Accordingly, methods are being developed to increase the reliability of the semiconductor memory device.

SUMMARY

Embodiments of the present disclosure provide a data storage device capable of checking whether there is a row line where a resistive defect occurs.

Embodiments of the present disclosure provide a data storage device including: a memory device including a plurality of memory blocks; and a memory controller configured to control the memory device, wherein the plurality of memory blocks are connected with row lines, wherein the row lines include word lines, wherein the memory controller is further configured to: check whether a resistive defect occurs at the row lines except for the word lines; and set a program operation time of a memory block corresponding to a row line, at which the resistive defect occurs, to be longer than a program operation time of the other memory blocks.

Embodiments of the present disclosure provide a data storage device including: a memory device including a plurality of memory blocks; and a memory controller configured to control the memory device, wherein the plurality of memory blocks are connected with row lines, wherein the row lines include word lines, wherein the memory controller is further configured to: check whether a resistive defect occurs at the row lines other than the word lines; and manage a memory block corresponding to a row line, at which the resistive defect occurs, as a bad block.

Embodiments of the present disclosure provide a data storage device including: a memory device including a plurality of memory blocks; and a memory controller, wherein the plurality of memory blocks are connected with row lines that include word lines, wherein the memory controller checks whether a resistive defect occurs at the row lines except for the word lines by setting a program operation time of a memory block selected from the plurality of memory blocks to be shorter than a program operation time of the other memory blocks.

BRIEF DESCRIPTION OF THE FIGURES

The above and other features of the present disclosure will become apparent by describing in detail embodiments thereof with reference to the accompanying drawings.

FIGS. 4A, 4B, 5A, 5B, 5C and 5D are diagrams for describing an issue when a resistive defect occurs at a row line other than word lines WLs in detail.

FIG. 6 is a flowchart illustrating an example of an operation of the resistive defect manager 1220 included in the data storage device 1000A of FIG. 1.

FIGS. 7A, 7B and 7C are diagrams for describing an example of a resistive defect pre-check operation of FIG. 6.

FIG. 9 is a diagram for describing another example of a resistive defect pre-check operation of FIG. 6.

FIGS. 10A and 10B are diagrams for describing another example of a resistive defect pre-check operation of FIG. 6.

FIGS. 11, 12A, and 12B are diagrams for describing an example of a resistive defect check operation of FIG. 6.

FIGS. 13A and 13B are diagrams for describing an example of a bad block managing operation of FIG. 6.

DETAILED DESCRIPTION OF THE EMBODIMENTS

Below, embodiments of the present disclosure will be described in detail and clearly to such an extent that one of ordinary skill in the art can implement the invention.

Figure 1:
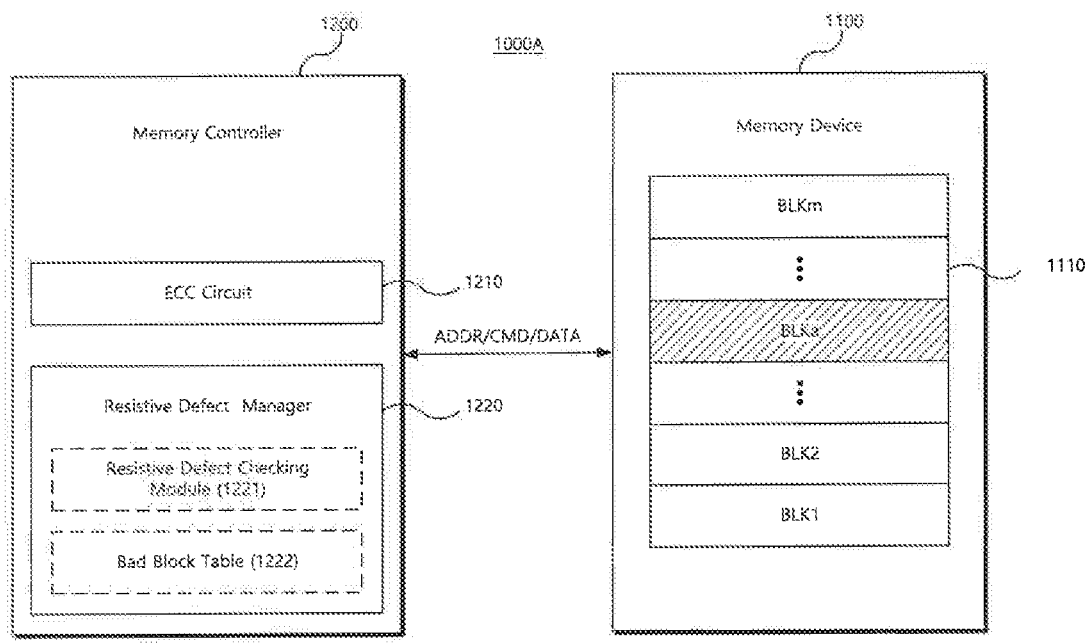
FIG. 1 is a block diagram illustrating a data storage device 1000A according to an embodiment of the present disclosure.

FIG. 1 is a block diagram illustrating a data storage device 1000A according to an embodiment of the present disclosure.

The data storage device 1000A according to an embodiment of the present disclosure may determine whether a resistive defect occurs at row lines connected with a plurality of memory blocks BLK1 to BLKm, in particular, at row lines other than word lines. Herein, the resistive defect may mean that the resistivity of a row line, such as a ground selection line or a string selection line, is abnormal. When the resistive defect occurs at a row line other than the word lines, a program operation may not be performed normally.

When the row line with the resistive defect is checked, the data storage device 1000A may manage a memory block including the row line with the resistive defect as a bad block such that the program operation is not performed on the memory block any longer. As such, the increase in read latency due to the resistive defect may be prevented, and the probability that an uncorrectable error occurs may decrease. Therefore, the reliability of data may be increased.

Referring to FIG. 1, the data storage device 1000A may include a memory device 1100 and a memory controller 1200.

The memory device 1100 receives an address signal ADDR, a command signal CMD, and user data "DATA" from the memory controller 1200. The memory device 1100 stores the user data "DATA" in the memory blocks BLK1 to BLKm of a memory cell array 1110 based on the address signal ADDR and the command signal CMD.

The memory controller 1200 includes an ECC circuit 1210 (e.g., an error correction code circuit) and a resistive defect manager 1220.

The ECC circuit 1210 generates an error correction code ECC for correcting an error bit of data received from the memory device 1100. The ECC circuit 1210 generates data to which a parity bit is added, by performing error correction encoding on data to be provided to the memory device 1100. The parity bit may be stored in the memory device 1100.

The ECC circuit 1210 may detect and correct an error of the user data "DATA" read from the memory device 1100. For example, the ECC circuit 1210 may generate the error correction code for the user data "DATA" to be stored in the memory device 1100. The generated error correction code may be stored in the memory device 1100 together with the user data "DATA".

Afterwards, the ECC circuit 1210 may detect and correct an error of the user data "DATA" read from the memory device 1100, based on the error correction code thus stored. In other words, the ECC circuit 1210 may have a given error correction capability. Data that include error bits (or fail bits), the number of which exceeds the error correction capability of the ECC circuit 1210, may be referred to as "uncorrectable ECC (UECC) data".

The resistive defect manager 1220 checks whether there is a memory block, which is connected with (or includes) a row line with the resistive defect, from among the memory blocks BLK1 to BLKm of the memory device 1100. When the memory block including the row line with the resistive defect is determined, the resistive defect manager 1220 manages the memory block as a bad block. To accomplish this, the resistive defect manager 1220 includes a resistive defect checking module 1221 and a bad block table 1222.

The resistive defect checking module 1221 checks if there is a row line having the resistive defect from among the row lines from which the word lines are excluded. According to an embodiment of the present disclosure, the resistive defect checking module 1221 may first perform a resistive defect pre-check operation in which it checks to see if the probability that a row line with the resistive defect exists is higher than or equal to a given level, and may additionally perform a resistive defect check operation only when a result of the resistive defect pre-check operation indicates that the probability is high.

For example, the resistive defect pre-check operation may be performed based on how many error bits occur in a memory block, the degree of disturb of threshold voltages of memory cells included in an unselected string, a correction level of a recovery code algorithm, or a voltage level distribution of a row line.

In addition, for example, the resistive defect check operation may be performed by adjusting (or tuning) a recovery time margin in the program operation.

When the row line with the resistive defect is checked, the resistive defect checking module 1221 may store an address of a memory block including the row line with the resistive defect in the bad block table 1222 and may manage the memory block as a bad block. In this case, afterwards, the program operation may not be performed on the memory block connected with the row line where the resistive defect occurs.

As described above, the data storage device 1000A according to an embodiment of the present disclosure may check a row line having the resistive defect from among the row lines from which the word lines are excluded and may manage the memory block including the row line with the resistive defect as a bad block. Accordingly, the read latency may be prevented from being increased due to the resistive defect, and the probability that the UECC data occur may decrease.

Figure 2:
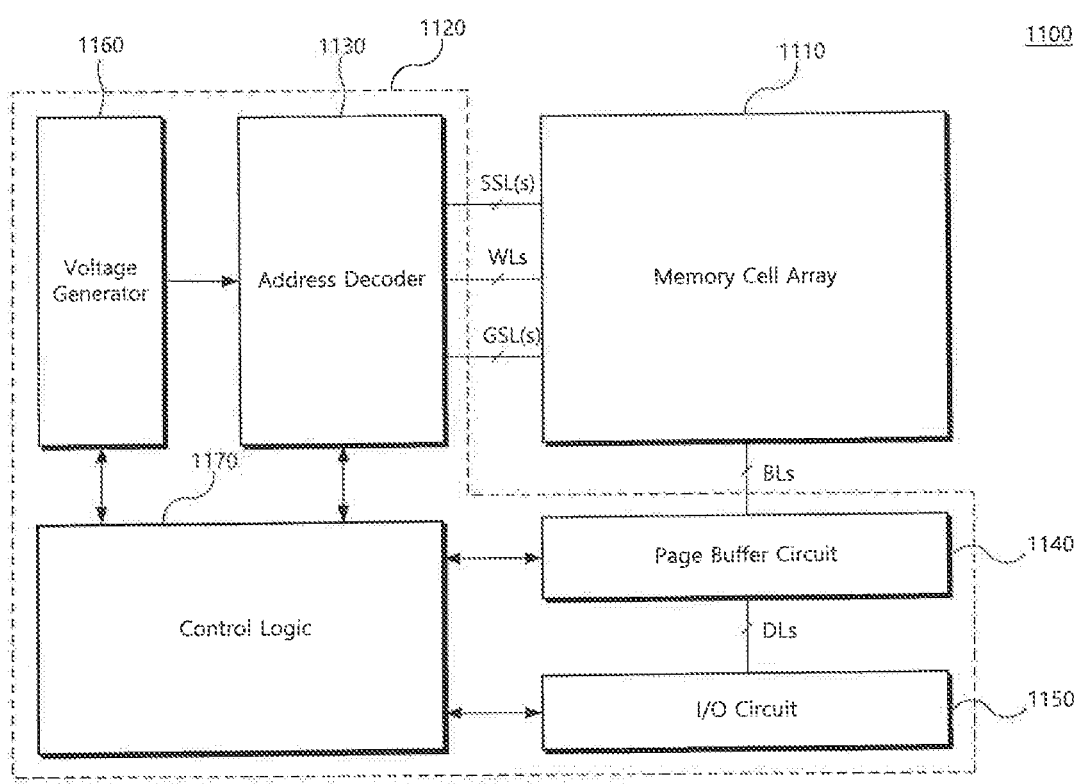
FIG. 2 is a block diagram illustrating an example of the memory device 1100 of FIG. 1.

FIG. 2 is a block diagram illustrating an example of the memory device 1100 of FIG. 1. Referring to FIG. 2, the memory device 1100 includes the memory cell array 1110 and a peripheral circuit 1120, and the peripheral circuit 1120 includes an address decoder 1130, a page buffer circuit 1140, an input/output (I/O) circuit 1150, a voltage generator 1160, and control logic 1170.

The memory cell array 1110 includes a plurality of memory blocks. Each of the memory blocks may have a two-dimensional structure or a three-dimensional structure. Memory cells of a memory block with the two-dimensional structure (or a horizontal (or planar) structure) are formed in a direction parallel to a substrate. Memory cells of a memory block with the three-dimensional structure (or a vertical structure) are formed in a direction perpendicular to the substrate. Multi-bit data may be stored in each of the memory cells.

The address decoder 1130 is connected with the memory cell array 1110 through row lines. Herein, the row lines may include selection lines, such as a string selection line SSL or a ground selection line GSL, and word lines WLs. In addition, according to an embodiment of the present disclosure, the row lines may further include dummy word lines disposed adjacent to the selection lines. In addition, in the case where the memory cell array 1110 has a multi-stack structure where two or more stacks are layered, the row lines may further include dummy word lines connected with dummy cells disposed on the junction of the multi-stack structure.

The address decoder 1130 may select one of the plurality of memory blocks under control of the control logic 1170. In addition, the address decoder 1130 may select one of the word lines WLs in the program operation.

The page buffer circuit 1140 is connected with the memory cell array 1110 through column lines. A column line may include, for example, a bit line BL of a plurality of bit lines BLs. The page buffer circuit 1140 may temporarily store data to be programmed at a selected page or data read from the selected page.

The input/output circuit 1150 may be connected with the page buffer circuit 1140 through data lines DLs internally, and may be connected with the memory controller 1200 (refer to FIG. 1) through input/output lines externally. The input/output circuit 1150 may receive data to be programmed in a selected memory cell of the memory cell array 1110 in the program operation from the memory controller 1200 and may provide the memory controller 1200 with data read from the selected memory cell in a read operation.

The voltage generator 1160 is supplied with an internal power from the control logic 1170 and generates a row line voltage used to read or write data. The row line voltage may be provided to the string selection line SSL, the word line WL, and/or the ground selection line GSL through the address decoder 1130.

The control logic 1170 may control an overall operation of the memory device 1100 in response to the command CMD and the address ADDR provided from the memory controller 1200.

Figure 3:
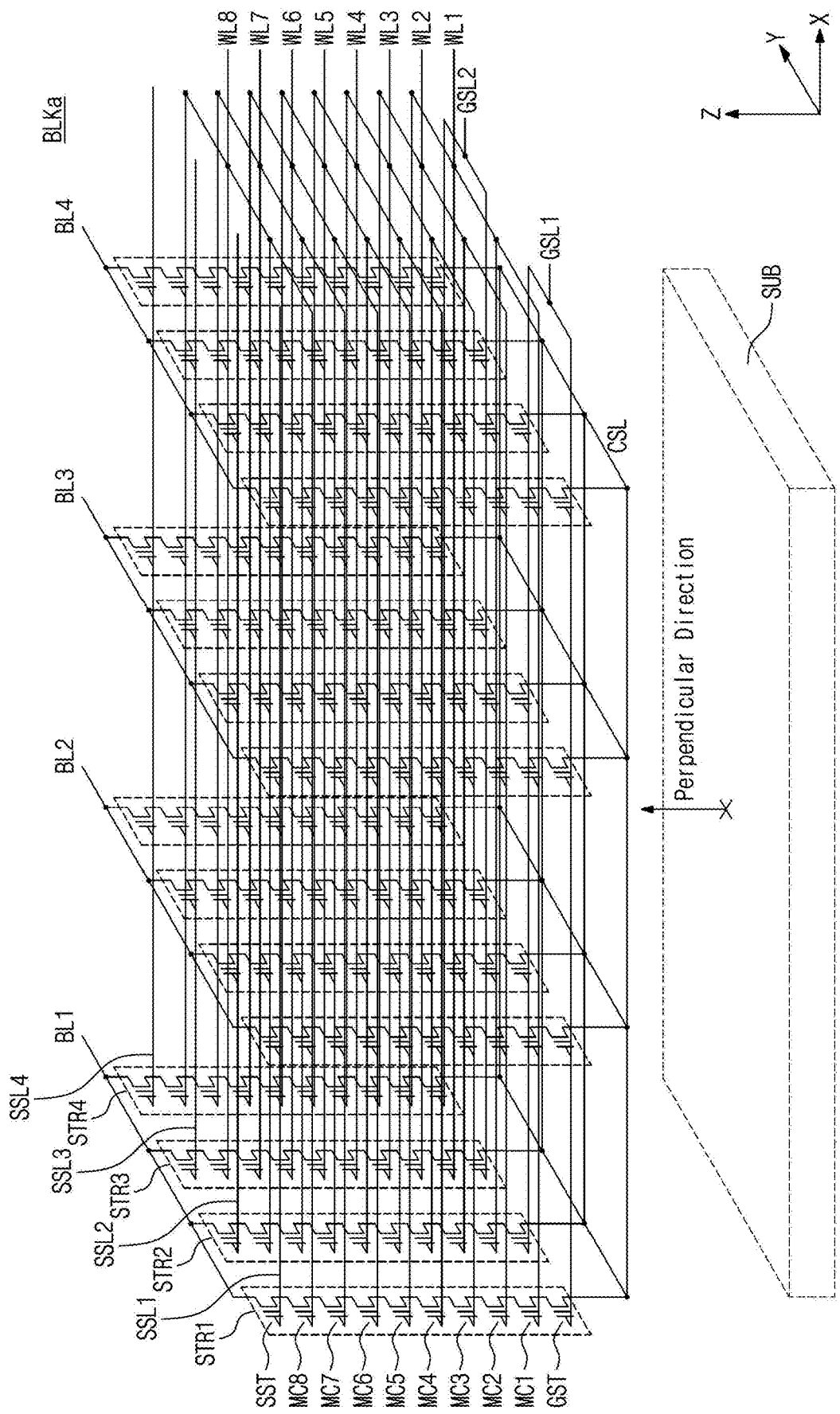
FIG. 3 is a circuit diagram illustrating an example of one memory block BLKa of the memory blocks BLK1 to BLKm of FIG. 1.

FIG. 3 is a circuit diagram illustrating an example of one memory block BLKa of the memory blocks BLK1 to BLKm of FIG. 1. Referring to FIG. 3, a plurality of strings STR (e.g., STR1, STR2, STR3 and STR4) may be arranged on a substrate SUB along rows and columns. The plurality of strings STR may be connected in common with a common source line CSL formed on (or in) the substrate SUB. In FIG. 3, a location of the substrate SUB is depicted as an example for better understanding of the structure of the memory block BLKa.

An example in which the common source line CSL is connected with lower ends of the strings STR is illustrated in FIG. 3. However, the present disclosure is not limited to the case that the common source line CSL is physically located at the lower ends of the strings STR. An example is illustrated in FIG. 3 in which the strings STR are arranged in a four-by-four matrix. However, the number of strings in the memory block BLKa may increase or decrease.

The strings STR in each row may be connected in common with a ground selection line GSL1 or GSL2. For example, strings STR in first and second rows may be connected in common with the first ground selection line GSL1, and strings STR in third and fourth rows may be connected in common with the second ground selection line GSL2. However, this is provided as an example. As another example, four different ground selection lines may be provided, and strings in each row may be implemented to be connected with different ground selection lines.

The strings STR in each row may be connected with a corresponding string selection line of first, second, third and fourth string selection lines SSL1, SSL2, SSL3 and SSL4. The strings STR in each column may be connected with a corresponding bit line of first, second, third and fourth bit lines BL1, BL2, BL3 and BL4.

Each string STR may include at least one ground selection transistor GST connected with the ground selection line GSL1 or GSL2, a plurality of memory cells MC1, MC2, MC3, MC4, MC5, MC6, MC7 and MC8 respectively connected with a plurality of word lines WL1, WL2, WL3, WL4, WL5, WL5, WL7 and WL8, and a string selection transistor SST connected to the string selection line SSL1, SSL2, SSL3, or SSL4.

In each string STR, the ground selection transistor GST, the memory cells MC1 to MC8, and the string selection transistor SST may be connected in series along a direction perpendicular to the substrate SUB and may be sequentially stacked along the direction perpendicular to the substrate SUB. In each string STR, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8.

In an embodiment of the present disclosure, the resistive defect may occur at a row line among row lines from which the word lines WLs are excluded. For example, the resistive defect may occur at the ground selection line GSL and/or the string selection line SSL. A memory block including the row line with the resistive defect may be managed as a bad block.

In detail, the resistive defect of the row line may be caused by various factors. For example, in the case where the memory cell array 1110 is formed in the three-dimensional structure, the row lines may be connected with the address decoder 1130 through a metal contact plug formed in a vertical direction. A diameter of the metal contact plug formed in the vertical direction may decrease as it goes toward the substrate SUB. Accordingly, in a region where the metal contact plug and the row line contact each other, the resistivity may become greater than an expected value; in this case, the resistive defect hindering the transfer of charges may occur. In addition, the resistive defect may occur due to degradation resulting from the use of the row line (or the access to the row line).

When the program operation is performed in the memory block including the row line with the resistive defect, more error bits may occur compared to a normal memory block. As such, when the read operation is performed on the memory block, the number of times that the error correction operation is performed may relatively increase, thereby causing an increase in read latency. In addition, the frequency at which an uncorrectable error occurs may also increase. This means that the reliability of data stored in the memory device 1100 is reduced.

According to an embodiment of the present disclosure, the row line with the resistive defect may be detected in advance through the resistive defect pre-check operation and the resistive defect check operation. Since the row line with the resistive defect is detected in advance, the memory block including the row line with the resistive defect may be managed as a bad block, and thus, an increase in read latency may be prevented. In addition, the frequency of occurrence of UECC data may decrease, in other words, the reliability of data stored in the memory cell array 1110 may increase.

Figure 4B:
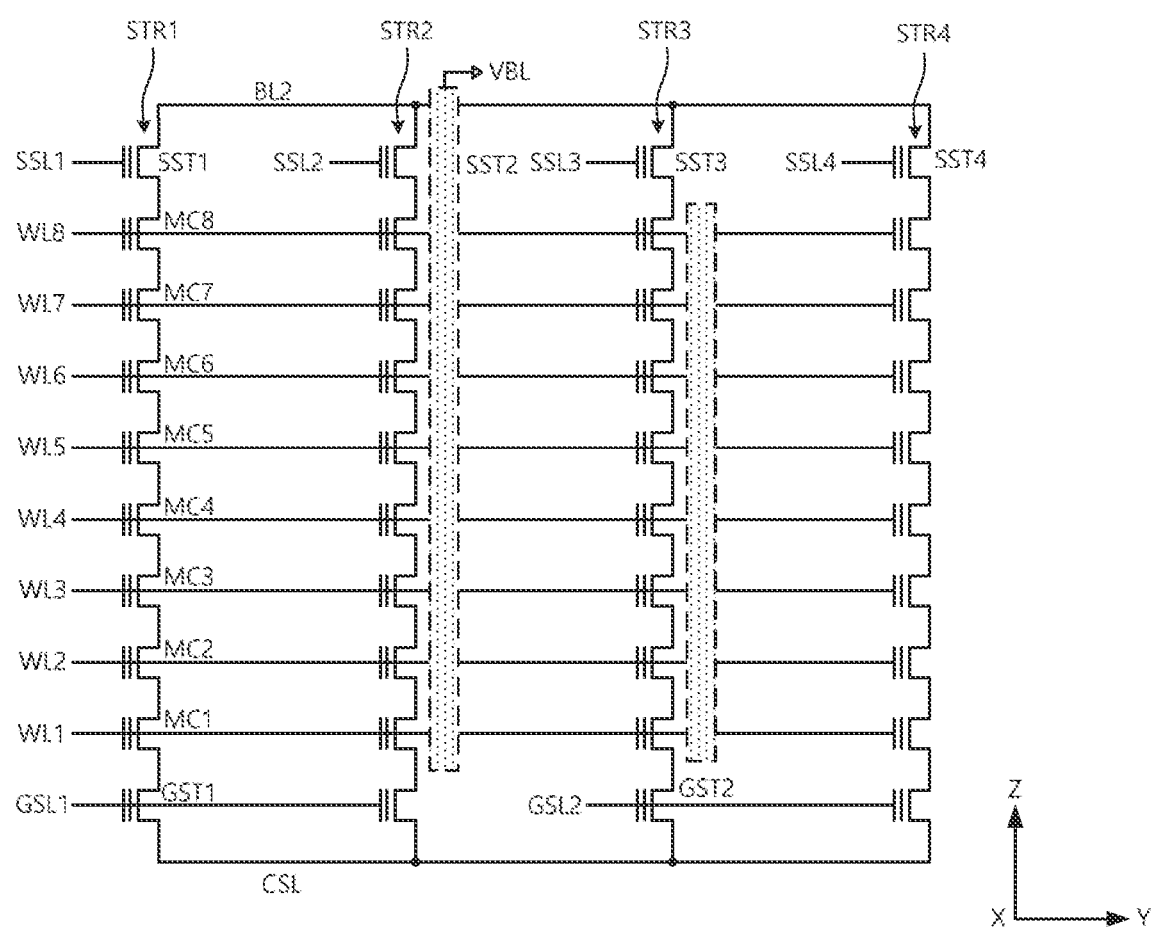

FIGS. 4A, 4B, and 5A to 5D are diagrams for describing an issue when a resistive defect occurs at a row line other than word lines WLs in detail. In detail, FIGS. 4A and 4B are diagrams illustrating an example of a program operation that is performed in a state where a resistive defect does not occur, and FIGS. 5A to 5D are diagrams illustrating an example of a program operation that is performed in a state where a resistive defect exists. For convenience of description, in FIGS. 4A, 4B, and 5A to 5D, it is assumed that a second string STR2 of strings STR1 to STR4 connected with the second bit line BL2 of the memory block BLKa of FIG. 3 is selected. In addition, it is assumed that the fourth word line WL4 is selected and a program voltage Vpgm is provided to the fourth word line WL4.

An example of voltage levels that are provided to row lines when the program operation is performed in a state where there is no resistive defect is illustrated in FIG. 4A. An example of channels formed in the second string STR2 and the third string STR3 at a point in time T3 of FIG. 4A is illustrated in FIG. 4B. For convenience of description, channels formed in strings are marked by a dashed box.

Referring to FIGS. 4A and 4B, at a point in time T0, a pre-pulse voltage Vpre is provided to the string selection lines SSL1 to SSL4 and the ground selection lines GSL1 and GSL2. As such, the selection transistors SST and GST included in each string are turned on, and a channel of each string is initialized with a ground (GND) voltage level.

At a point in time T1, a ground (GND) voltage is provided to the unselected string selection lines SSL1, SSL3, and SSL4 and the ground selection lines GSL1 and GSL2. As such, voltage levels of the unselected string selection lines SSL1, SSL3, and SSL4 and the ground selection lines GSL1 and GSL2 transition from the high level to the low level. In other words, the unselected string selection lines SSL1, SSL3, and SSL4 and the ground selection lines GSL1 and GSL2 are recovered.

At a point in time T2, a pass voltage Vpass is provided to the unselected word lines WL1 to WL3 and WL5 to WL8. As such, voltage levels of the unselected word lines WL1 to WL3 and WL5 to WL8 start to transition from the low level to the high level. The pass voltage Vpass and the program voltage Vpgm are sequentially provided to the selected word line, in other words, the fourth word line WL4. As such, a voltage level of the selected word line WL4 starts to transition from the low level to the high level.

At the point in time T3, the transition of the voltage level of the selected word line WL4 is completed. As such, a memory cell belonging to the selected string, in other words, the second string STR2 from among the fourth word line WL4 is programmed.

Below, a channel state at the point in time T3 will be described in detail with reference to FIG. 4B. As the voltage levels of the selected string selection line SSL2 and the selected ground selection line GSL1 completely transition to the high level, the string selection transistor SST2 included in the selected second string STR2 is turned on. Accordingly, an upper end of a channel formed in the selected second string STR2 is connected with the second bit line BL2. In the figures, VBL may correspond to a bit line voltage.

At the point in time T3, the unselected third string selection line SSL3 and the unselected second ground selection line GSL2 are at the low level. Accordingly, the string selection transistor SST3 and the ground selection transistor GST2 included in the unselected third string STR3 are turned off In this case, an upper end of a channel formed in the third string STR3 that is unselected is separated from the second bit line BL2, and a lower end of the channel is separated from the common source line CSL. In other words, the channel formed in the third string STR3 that is unselected is floated. When the program voltage Vpgm is applied through the fourth word line WL4 with the channel of the third string STR3 floated, the channel of the third string STR3 that is unselected is boosted. According to the above description, a voltage difference between the program voltage Vpgm and a channel voltage decreases, and thus, the program disturb phenomenon is suppressed.

Figure 5B:
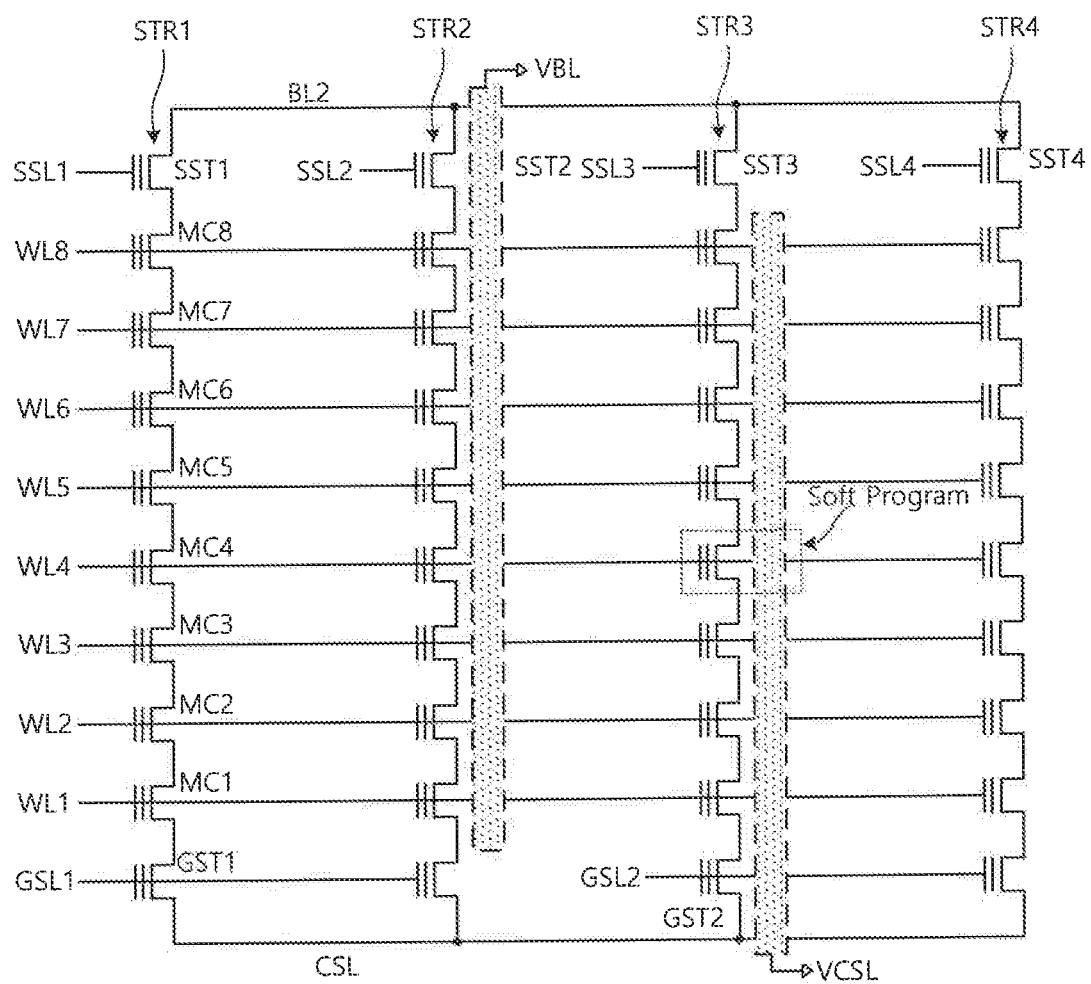

An example of voltage levels that are provided to row lines when the program operation is performed in a state where the resistive defect occurs at the second ground selection line GSL2 is illustrated in FIG. 5A. An example of channels formed in the second string STR2 and the third string STR3 at a point in time T3 of FIG. 5A is illustrated in FIG. 5B. For convenience of description, in FIGS. 5A to 5D, it may be assumed that the resistive defect occurs at the second ground selection line GSL2. Voltage levels of FIG. 5A are similar to the voltage levels of FIG. 4A, and thus, additional description will be omitted to avoid redundancy.

When the resistive defect occurs, a voltage level of a row line with the resistive defect transitions slowly. For example, as illustrated in FIG. 5A, a voltage level of the second ground selection line GSL2 with the resistive defect transitions slowly compared to the first ground selection line GSL1 that is normal. In this case, the ground selection transistor GST2 connected with the second ground selection line GSL2 may maintain a turn-on state at the point in time T3. For example, at the point in time T3 there may still be voltage on the second ground selection line GSL2, thereby keeping the ground selection transistor GST2 switched on.

In detail, at a point in time T1, the voltage level of the second ground selection line GSL2 starts to transition from the high level to the low level. Because the second ground selection line GSL2 corresponds to the unselected strings STR3 and STR4, the voltage level of the second ground selection line GSL2 should completely transition to the low level until a point in time T2.

However, because the second ground selection line GSL2 has the resistive defect, the voltage level of the second ground selection line GSL2 slowly transitions to the low level. As such, the second ground selection line GSL2 may have a voltage level that allows the ground selection transistor GST2 to continuously maintain the turn-on state even at the point in time T3.

In detail, referring to FIG. 5B, because the second ground selection line GSL2 that is unselected still maintains the high level at the point in time T3, the ground selection transistor GST2 included in the third string STR3 that is unselected is in the turn-on state. In this case, a lower end of a channel formed in the third string STR3 that is unselected is not separated from the common source line CSL. In other words, the channel formed in the third string STR3 that is unselected is connected with the common source line CSL, not floated. In the figures, VCSL may correspond to a common source line voltage.

When the program voltage Vpgm is applied through the fourth word line WL4 under the above condition, the hot carrier injection (HCI) occurs due to a voltage difference between the program voltage Vpgm and a voltage of the channel formed in the third string STR3 that is unselected; in this case, a memory cell of the third string STR3 that is unselected is soft programmed. Herein, the soft program refers to an increase in threshold voltages of unselected memory cells by the program disturb coming from the resistive defect.

Figure 5C:
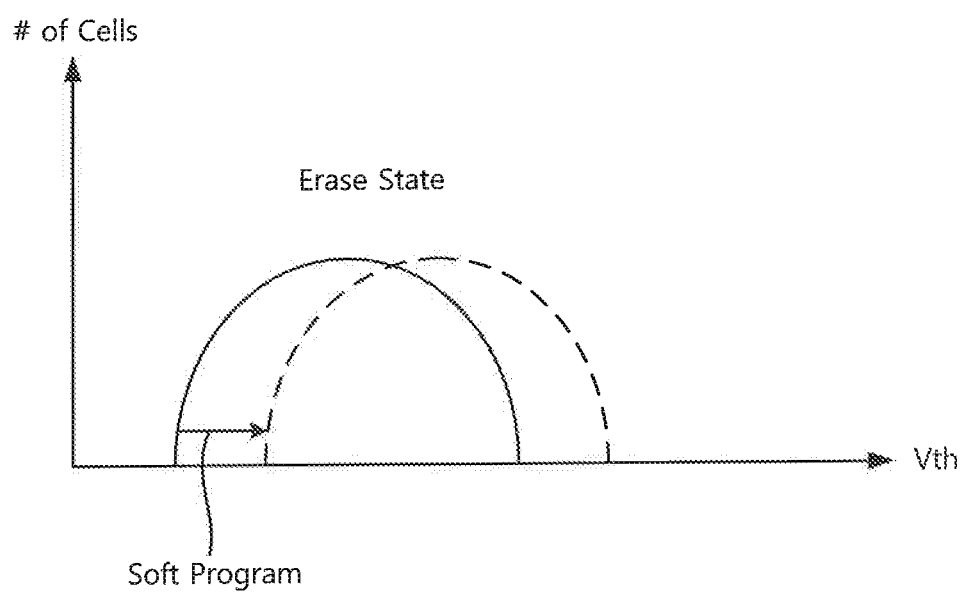

For example, as illustrated in FIG. 5C, memory cells of an unselected string, which are in an erase state, may be soft programmed by the program disturb coming from the resistive defect. As the degree of the resistive defect becomes greater, an increment of a threshold voltage by the soft program may become greater.

Figure 5D:
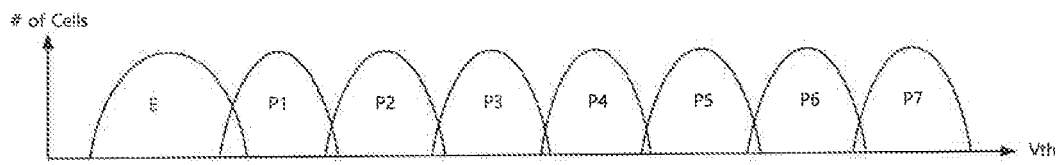

Afterwards, when the program operation is performed on the soft-programmed memory cells of the erase state (E), as illustrated in FIG. 5D, a distribution valley of threshold voltages of memory cells may be formed at a higher location. When the read operation is performed on memory cells whose threshold voltage distribution valley is formed at a higher location, an error bit may be included in the read data. In this case, the error correction operation of the ECC circuit 1210 (refer to FIG. 1) should be performed (or accompanied). As the degree of the resistive defect becomes greater, the number of error bits included in the read data increases; in this case, a time taken for the ECC circuit 1210 to perform the error correction code operation increases. In addition, as the degree of the resistive defect becomes greater, the probability that the UECC data occurs increases, thereby causing the reduction of the reliability of data. In the figures, P1 to P7 may refer to program states.

Because the second ground selection line GSL2 corresponds to the third and fourth strings STR3 and STR4, the resistive defect that occurs at the second ground selection line GSL2 may affect all of the memory cells included in the third and fourth strings STR3 and STR4. For example, it is assumed that the program voltage Vpgm is provided in order from the first word line WL1 to the eighth word line WL8. Because the resistive defect occurs at the second ground selection line GSL2, all of the memory cells connected with the first to eighth word lines WL1 to WL8 may be sequentially soft programmed. This means that the probability that an error bit occurs in all of the memory cells included in the third and fourth strings STR3 and STR4 increases. As a result, the frequency at which an error bit occurs and the probability of occurrence of the UECC data become relatively great compared to the case where the resistive defect occurs at one word line.

A data storage device according to an embodiment of the present disclosure may check, in advance, the resistive defect occurring at a row line except for a word line and may manage, as a bad block, a memory block connected with the row line where the resistive defect occurs. As such, the increase in the read latency may be prevented, and the frequency at which the UECC data occur may decrease. Below, an operation of a data storage device according to an embodiment of the present disclosure will be described in detail.

FIG. 6 is a flowchart illustrating an example of an operation of the resistive defect manager 1220 included in the data storage device 1000A of FIG. 1.

In operation S110, the resistive defect pre-check operation is performed. Through the resistive defect pre-check operation, the resistive defect manager 1220 may check to see if the probability that there is a row line where the resistive defect exists is higher than or equal to a given level. For example, the resistive defect pre-check operation may be performed based on how many error bits occur in a memory block, the degree of disturb of threshold voltages of memory cells included in an unselected string, a correction level of a recovery code algorithm, or a voltage level distribution of a row line.

In operation S120, the resistive defect check operation is performed. Through the resistive defect check operation, the resistive defect manager 1220 may finally check if there is a row line where the resistive defect occurs. For example, the resistive defect check operation may be performed by adjusting (or tuning) a recovery time margin in the program operation.

In operation S130, a memory block including the row line with the resistive defect is managed as a bad block. For example, the resistive defect manager 1220 may store an address of the memory block including the row line with the resistive defect in the bad block table 1222 (refer to FIG. 1) and may manage the memory block as a bad block.

In an embodiment of the present disclosure, the resistive defect pre-check operation and the resistive defect check operation may be performed as a background operation. Accordingly, the influence of the resistive defect pre-check operation and the resistive defect check operation on the performance of the data storage device 1000A may be minimized, and the reliability of data may be further increased. In addition, the resistive defect pre-check operation may be quickly performed by using a characteristic of a resistive defect occurring at a row line except for a word line. Accordingly, the data storage device 1000A may quickly check the resistive defect occurring at a row line except for a word line.

Figure 7A:
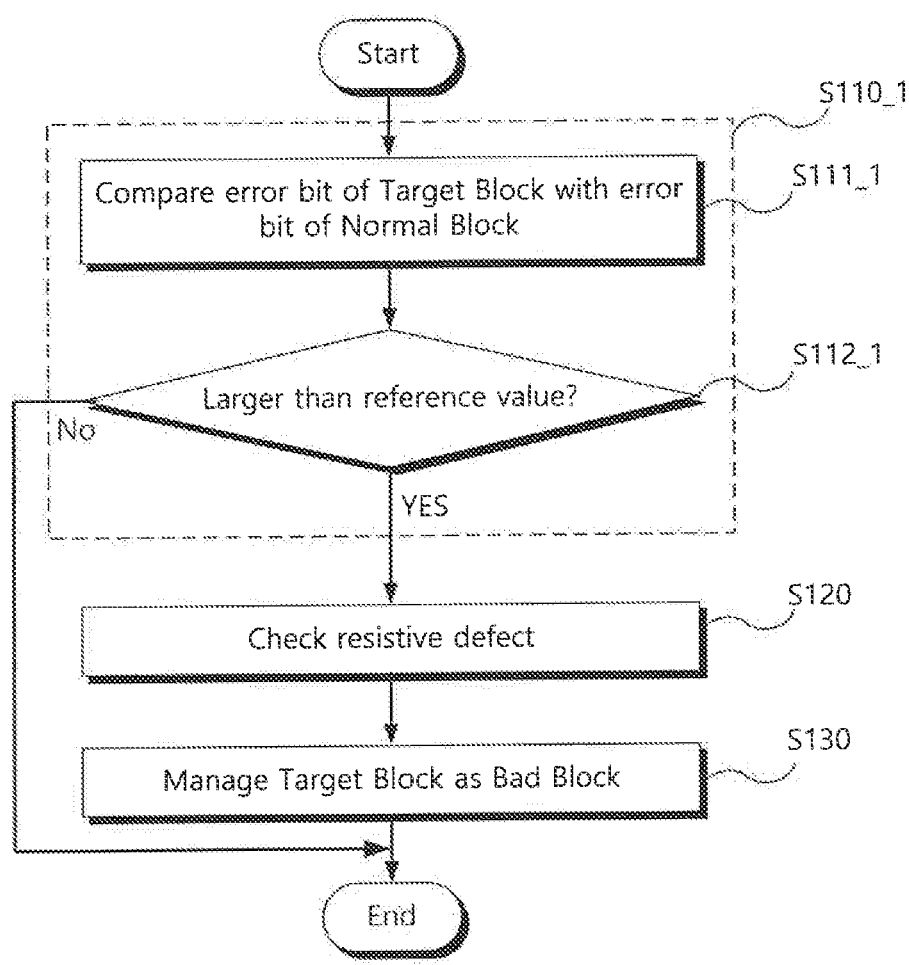

FIGS. 7A to 7C are diagrams for describing an example of a resistive defect pre-check operation of FIG. 6. In detail, FIG. 7A is a flowchart illustrating the resistive defect pre-check operation based on how many error bits occur in a memory block (hereinafter referred to as a "target block") connected with a row line where the resistive defect occurs. FIG. 7B is a diagram illustrating an example of error bits occurring in the target block and a normal block. FIG. 7C is a diagram illustrating an example of error bits occurring at a specific page and a normal page of the target block.

Referring to FIG. 7A, in operation S110_1, the resistive defect pre-check operation is performed.

In detail, in operation S111_1, the resistive defect manager 1220 compares the number of error bits of the target block with the number of error bits of the normal block.

In operation S112_1, the resistive defect manager 1220 determines whether the number of error bits of the target block exceeds a reference value. Herein, the reference value may be set variously. For example, the reference value may be set to a multiple (e.g., 10 times) of an average value of the numbers of error bits occurring in the normal block. As another example, the reference value may be set to a value corresponding to the maximum number of error bits occurring in the normal block. Thus, the reference value may be set variously.

When it is determined that the number of error bits of the target block exceeds the reference value, the resistive defect manager 1220 performs the resistive defect check operation on the target block (S120). When it is determined that the number of error bits of the target block does not exceed the reference value, the resistive defect manager 1220 determines that the resistive defect is absent from a row line corresponding to the target block.

As described with reference to FIGS. 4A to 5D, when the resistive defect occurs at the row line such as a ground selection line, error bits may occur at all of the memory cells included in strings corresponding to the row line. As such, the average number of error bits of the memory block corresponding to the row line with the resistive defect may have a great difference from the normal block.

For example, as illustrated in FIG. 7B, when the number of error bits of the target block differs from the number of error bits of the normal block as much as 10 times or more, the resistive defect manager 1220 may determine that the probability that the resistive defect occurs at the row line connected with the target block is high. In this case, the resistive defect manager 1220 may additionally perform the resistive defect check operation to finally check whether the resistive defect occurs in the target block. As described above, the resistive defect manager 1220 may first simply and quickly check whether the resistive defect occurs at the row line, based on the number of error bits detected in the target block.

Although the description is given with reference to FIGS. 7A and 7B as the number of error bits of the target block is checked, the present disclosure is not limited thereto. For example, as illustrated in FIG. 7C, the resistive defect manager 1220 may perform the resistive defect pre-check operation based on a result of comparing the number of error bits of a target page with the number of error bits of a normal page. Herein, the target page may refer to a specific page of the target block. For example, when the number of error bits of the target page differs from the number of error bits of the normal page as much as 10 times or more, the resistive defect manager 1220 may determine that the probability that the resistive defect occurs at a row line connected with a memory block including the target page is high.

Figure 8A:
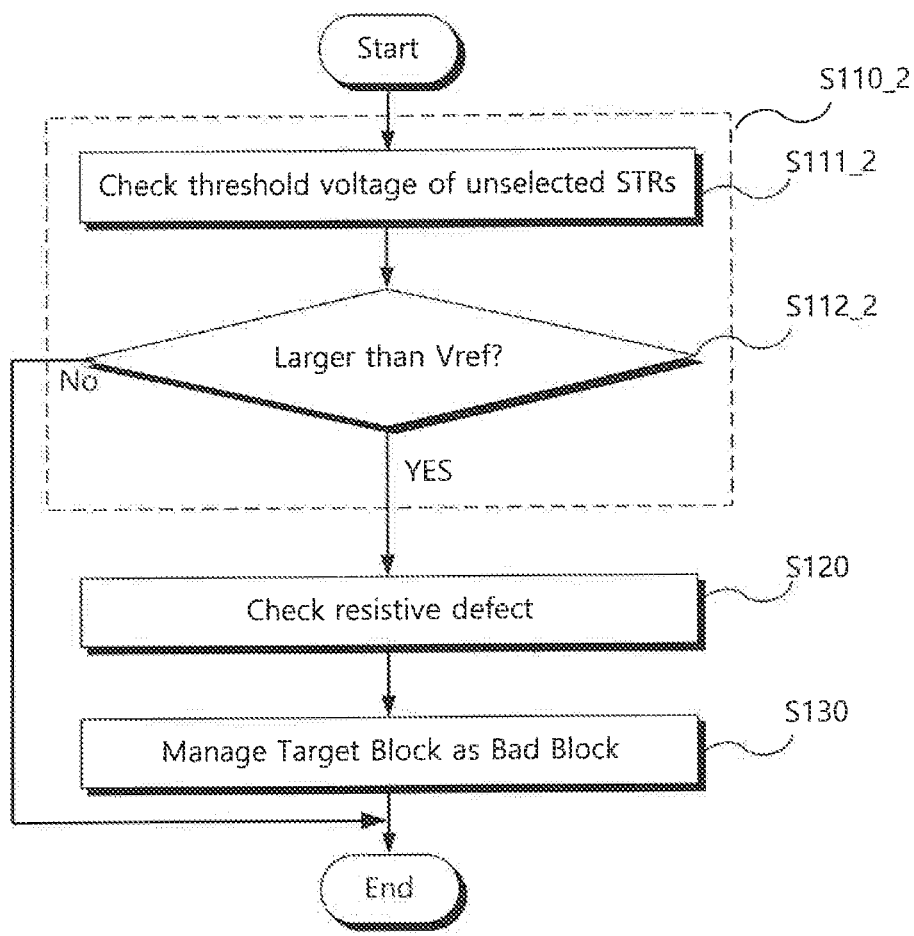
FIGS. 8A and 8B are diagrams for describing another example of a resistive defect pre-check operation of FIG. 6.
Figure 8B:
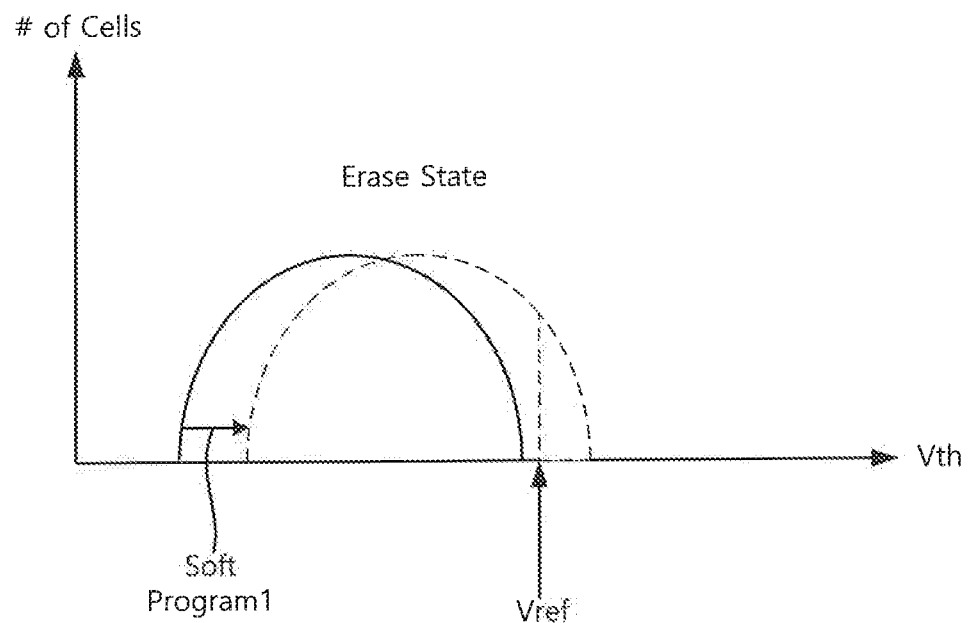

FIGS. 8A and 8B are diagrams for describing another example of a resistive defect pre-check operation of FIG. 6. In detail, FIG. 8A is a flowchart illustrating the resistive defect pre-check operation that is based on the degree of disturb of threshold voltages of memory cells included in an unselected string. FIG. 8B is a diagram illustrating an example where threshold voltages of memory cells of an erase state included in the unselected string are disturbed.

Referring to FIG. 8A, in operation S110_2, the resistive defect pre-check operation is performed.

In detail, in operation S111_2, the resistive defect manager 1220 may check threshold voltages of memory cells of included in the unselected string and may count the number of memory cells having threshold voltages, which are larger than a reference voltage Vref, from among the checked threshold voltages.

For example, as illustrated in FIG. 5B, the memory cells included in the unselected strings STR3 and STR4 may be provided with the program voltage Vpgm through the fourth word line WL4. The resistive defect manager 1220 may check threshold voltages of the memory cells included in the unselected strings STR3 and STR4. As illustrated in FIG. 8B, the resistive defect manager 1220 may count the number of memory cells, the threshold voltages of which are larger than the reference voltage Vref, from among the memory cells of the erase state.

In operation S112_2, the resistive defect manager 1220 determines whether the number of memory cells, the threshold voltages of which are larger than the reference voltage Vref, exceeds a reference value. When it is determined that the number of memory cells, the threshold voltages of which are larger than the reference voltage Vref, exceeds the reference value, the resistive defect manager 1220 performs the resistive defect check operation on a row line corresponding to the unselected string (S120). When it is determined that the number of memory cells, the threshold voltages of which are larger than the reference voltage Vref, does not exceed the reference value, the resistive defect manager 1220 determines that the resistive defect does not occur at the row line corresponding to the unselected string.

As described with reference to FIG. 5C, when the resistive defect occurs at the row line except for word lines, memory cells of the erase state included in the unselected string may be soft programmed by the program disturb. As the degree of the resistive defect becomes greater, an increment of threshold voltages of the memory cells of the erase state by the soft program may become greater.

Accordingly, as illustrated in FIG. 8B, when the number of memory cells of the erase state, which have threshold voltages exceed the reference voltage Vref, is more than or equal to a given value, the resistive defect manager 1220 may determine that the probability that the resistive defect occurs at the row line corresponding to the unselected strings is high. In this case, the resistive defect manager 1220 may additionally perform the resistive defect check operation to finally check whether the resistive defect occurs. As described above, the resistive defect manager 1220 may first check whether the resistive defect occurs at the row line, based on the number of memory cells of the erase state, which have threshold voltages exceeding the reference voltage Vref.

FIG. 9 is a diagram for describing another example of a resistive defect pre-check operation of FIG. 6. The resistive defect pre-check operation that is based on a correction level of a recovery code algorithm is illustrated in FIG. 9 as an example.

Referring to FIG. 9, in operation S110_3, the resistive defect pre-check operation is performed.

In detail, in operation S111_3, the resistive defect manager 1220 checks whether there is an error bit on which an ECC operation is performed at a reference-recovery level by the recovery code algorithm.

The recovery code algorithm may have a plurality of recovery levels. For example, the recovery code algorithm may have first to tenth recovery levels; when the ECC operation performed by using the first recovery level fails, the ECC operation may be performed by using the second recovery level. In this way, until the error bit is corrected, the ECC operation may be sequentially performed by using the first to tenth recovery levels. In this case, the reference-recovery level may be set to one of the first to tenth recovery levels.

In operation S112_3, the resistive defect manager 1220 determines whether the error bit correction using the reference-recovery level fails.

When it is determined that the error bit is not corrected, the resistive defect manager 1220 performs the resistive defect check operation on a row line corresponding to a memory cell where the error bit occurs (S120). When it is determined that the error bit is corrected, the resistive defect manager 1220 determines that the resistive defect does not occur at the row line corresponding to the memory cell where the error bit occurs.

As described with reference to FIGS. 4 and 5, as the degree of the resistive defect occurring at the row line such as a ground selection line becomes greater, a location where a threshold voltage distribution valley of memory cells is formed becomes higher. This means that as the degree of the resistive defect becomes greater, the recovery level of the recovery code algorithm for correcting an error bit becomes higher. The resistive defect manager 1220 according to an embodiment of the present disclosure may first simply check whether the resistive defect occurs at the row line such as a ground selection line, by determining whether there is an error bit uncorrected at the reference-recovery level.

Figure 10B:
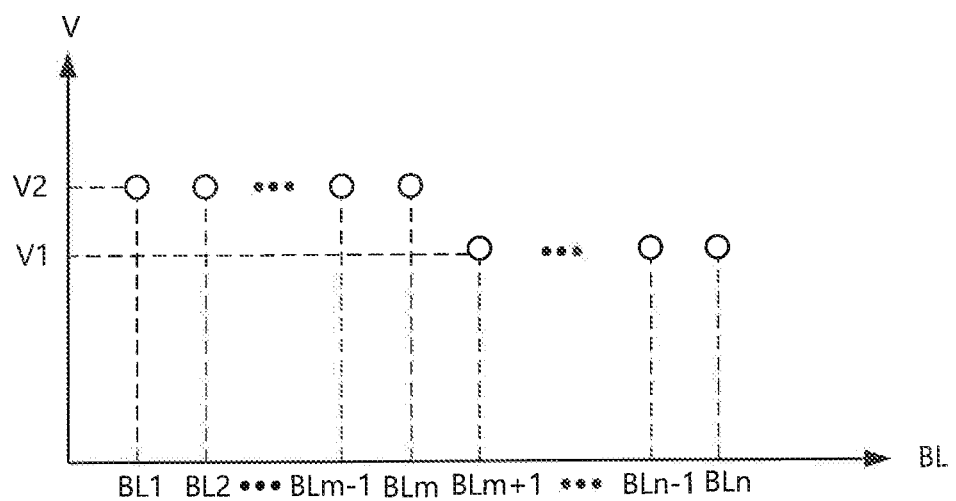

FIGS. 10A and JOB are diagrams for describing another example of a resistive defect pre-check operation of FIG. 6. In detail, FIG. 10A is a flowchart illustrating the resistive defect pre-check operation that is based on a distribution of voltage levels of a row line. FIG. 10B is a diagram illustrating an example of the ground selection line GSL where the resistive defect occurs.

Referring to FIG. 10A, in operation S110_4, the resistive defect pre-check operation is performed.

In detail, in operation S111_4, the resistive defect manager 1220 checks a distribution of voltage levels of a row line except for word lines. In an embodiment of the present disclosure, as illustrated in FIG. 10B, the resistive defect manager 1220 may check a distribution of voltage levels of the ground selection line GSL for respective locations of bit lines.

In operation S112_4, the resistive defect manager 1220 determines whether the voltage level distribution of the row line is abnormal (or unusual). For example, in the case where the resistive defect occurs, the ground selection line GSL may have two voltage level distributions formed at a first voltage level V1 and a second voltage level V2. In the case where the resistive defect does not occur, the voltage level distribution of the ground selection line GSL may be maintained at a given level.

When it is determined that the voltage level distribution of the row line is abnormal, the resistive defect manager 1220 performs the resistive defect check operation on the row line (S120). When it is determined that the voltage level distribution of the row line is normal, the resistive defect manager 1220 determines that the resistive defect does not occur at the row line.

As described with reference to FIGS. 7A to 10B, according to an embodiment of the present disclosure, the probability that the resistive defect occurs at the row line except for word lines may be first checked through the resistive defect pre-check operation. As such, whether the resistive defect occurs at the row line may be first quickly performed while minimizing the influence of the check operation on the performance of the data storage device 1000A.

Figure 11:
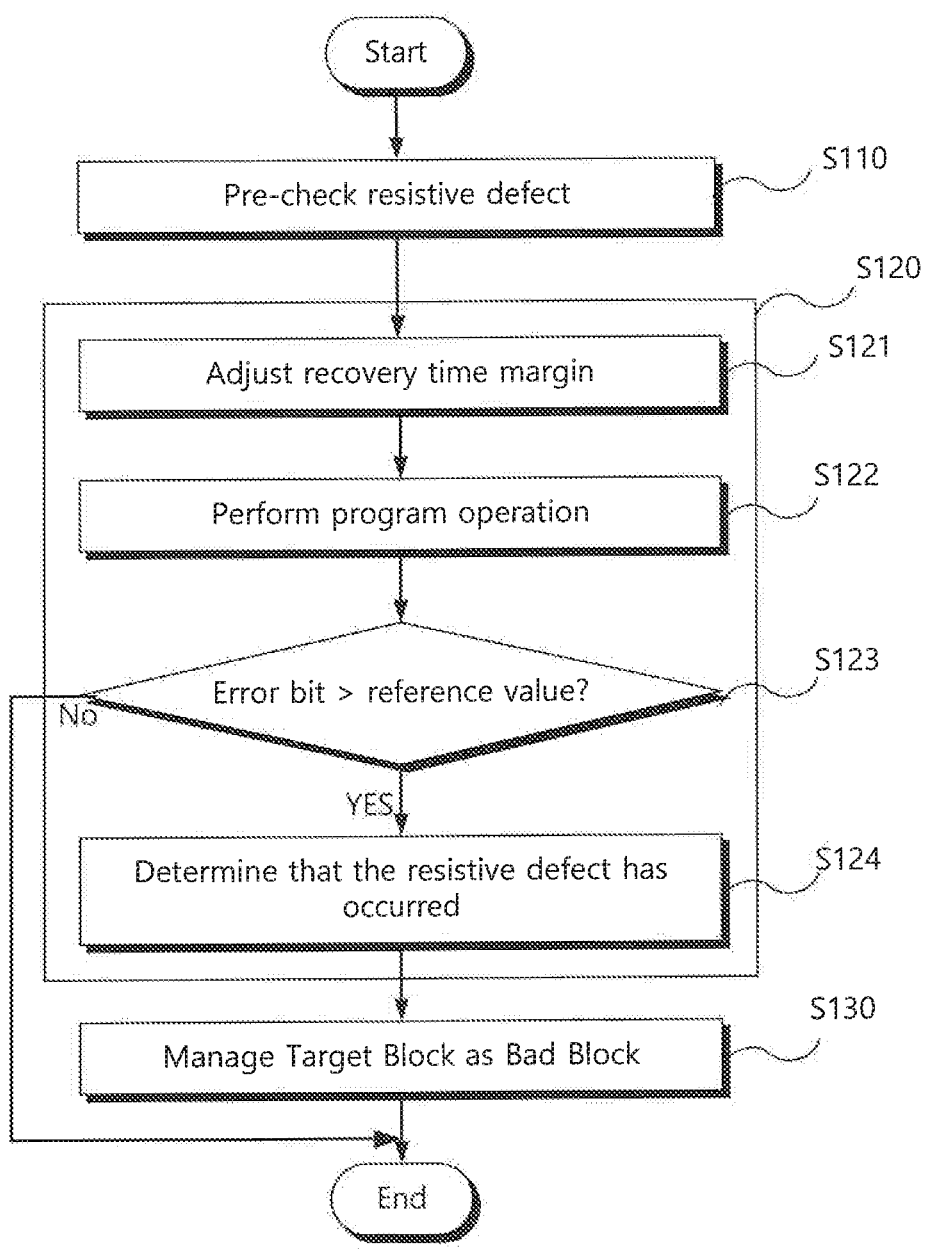
Figure 12A:
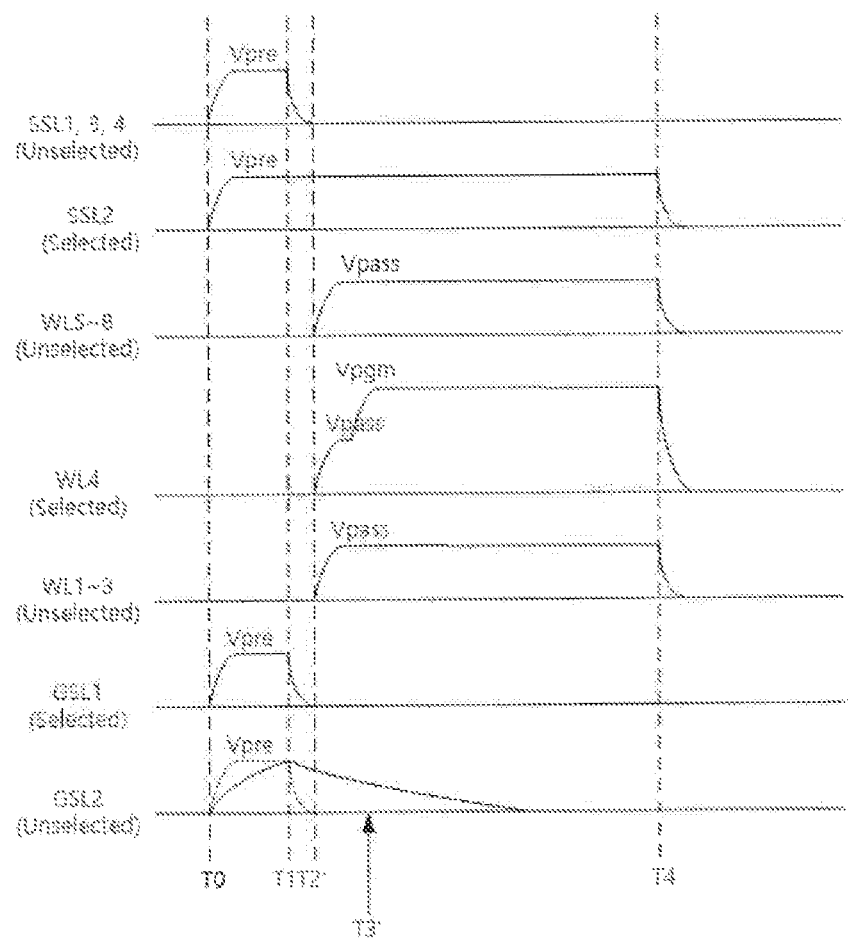
Figures 12B, 13A:
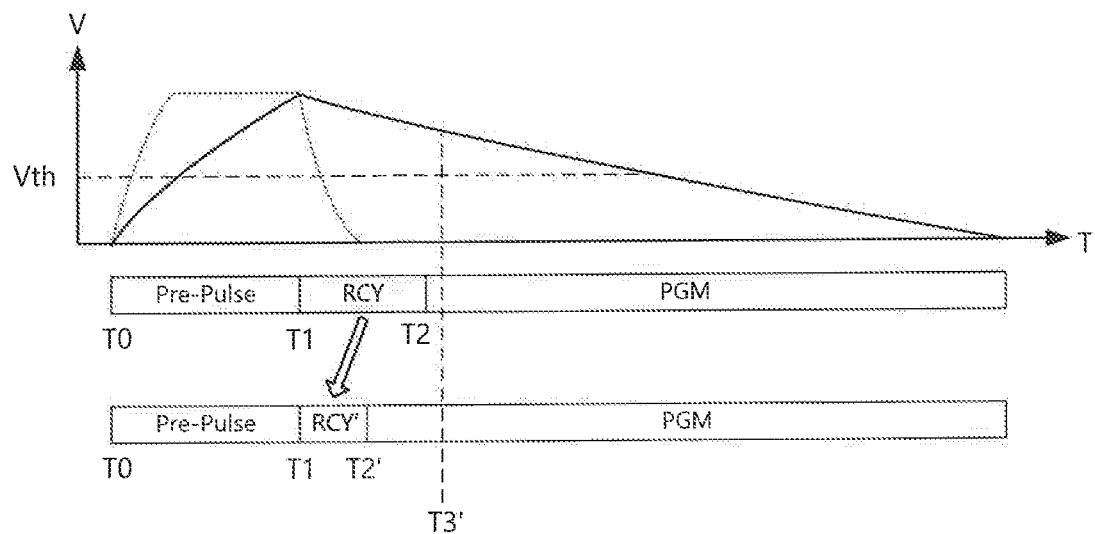

FIGS. 11, 12A, and 12B are diagrams for describing an example of a resistive defect check operation of FIG. 6. In detail, FIG. 11 is a flowchart illustrating the resistive defect check operation. FIG. 12A is a diagram illustrating an example of voltage levels that are provided to row lines in the resistive defect check operation. FIG. 12B is a diagram illustrating a voltage level of the ground selection line GSL with the resistive defect for each recovery time margin, in detail.

Voltage levels that are provided to row lines in the resistive defect check operation are similar to the voltage levels in the program operation of FIG. 5A. Accordingly, for convenience of description, like FIG. 5A, the following description will be given under the assumption that the resistive defect occurs at the second ground selection line GSL2, and the description that is given above will be omitted.

Referring to FIG. 11, in operation S110, the resistive defect pre-check operation is performed. When it is determined that the probability that the resistive defect occurs at a row line except for word lines is high, the resistive defect check operation is performed (S120).

In detail, in operation S121, the recovery time margin is adjusted. For example, the recovery time margin in the resistive defect check operation may be shorter than the recovery time margin in a normal program operation. Herein, the recovery time margin is a time during which the selection lines SSL1, SSL3, SSL4, GSL1, and GSL2 are recovered. For example, as illustrated in FIGS. 12A and 12B, the recovery time margin of the general case may correspond to a time period from T1 to T2. When the resistive defect check operation is performed, the recovery time margin may decrease to a time period from T1 to T2'.

In operation S122, the program operation is performed in a state where the recovery time margin decreases.

In detail, at a point in time T0, the pre-pulse voltage Vpre is provided to the string selection lines SSL1 to SSL4 and the ground selection lines GSL1 and GSL2. At a point in time T1, a ground (GND) voltage is provided to the unselected string selection lines SSL1, SSL3, and SSL4 and the ground selection lines GSL1 and GSL2; during the time period from T1 to T2', the unselected string selection lines SSL1, SSL3, and SSL4 and the ground selection lines GSL1 and GSL2 are recovered. Afterwards, at the point in time T2', the pass voltage Vpass is provided to the unselected word lines WL1 to WL3 and WL5 to WL8. The pass voltage Vpass and the program voltage Vpgm are sequentially provided to the selected word line, in other words, the fourth word line WL4. As can be seen, although the voltage level of the first ground selection line GSL1 drops to zero by the point in time T2', the voltage level of the second ground selection line GSL2 remains above zero beyond the point in time T2'.

In this case, because the recovery time margin decreases to the time period from T1 to T2', the voltage level of the second ground selection line GSL2 at a point in time T3' is higher than that of FIG. 5A. For example, as illustrated in FIG. 12B, the voltage level of the second ground selection line GSL2 at the point in time T3' may be higher than the threshold voltage level Vth of the ground selection transistor. As such, a turn-on time of the ground selection transistor may increase compared to that of FIG. 5A; in this case, the increment of threshold voltages of the memory cells included in the unselected strings STR3 and STR4 (refer to FIG. 4A) may become greater compared to that of FIG. 5A. As a result, the probability that the error bit occurs may become higher.

In operation S123, whether the number of error bits is more than a reference value is determined. Herein, the reference value may be set to the number of error bits that occur before the recovery time margin decreases.

When it is determined that the number of error bits is more than the reference value, the resistive defect manager 1220 determines that the row line except for word lines has the resistive defect (S124). In this case, the resistive defect manager 1220 manages a memory block including the row line with the resistive defect as a bad block (S130). When it is determined that the number of error bits is less than or equal to the reference value, the resistive defect manager 1220 determines that the resistive defect does not occur at the row line.

As described above, according to an embodiment of the present disclosure, whether the resistive defect occurs at the row line except for word lines may be accurately checked through the resistive defect check operation.

FIGS. 13A and 13B are diagrams for describing an example of a bad block managing operation of FIG. 6. In detail, FIG. 13A illustrates an example in which a memory block connected with a row line where the resistive defect occurs is managed in a bad block table. FIG. 13B illustrates an example in which strings connected with a row line where the resistive defect occurs is managed in a bad block table. For convenience of description, as in the description given with reference to FIG. 5A, it is assumed that the second ground selection line GSL2 has the resistive defect and corresponds to the third and fourth strings STR3 and STR4.

Referring to FIG. 13A, the resistive defect manager 1220 updates the bad block table to include the address ADDR of the memory block BLK2 connected with the second ground selection line GSL2 with the resistive defect. In this case, data stored in the memory block BLK2 may be stored in (or copied back to) any other memory block; afterwards, the access to the memory block BLK2 may be blocked. For example, the memory block BLK2 may be marked invalid, while other memory blocks BLK1 and BLK3 to BLK5 may be marked valid. Because the program operation for the memory block BLK2 is not performed any longer, the increase in the read latency due to the resistive defect of the second ground selection line GSL2 may be prevented, and the probability that the UECC data occur may decrease.

Referring to FIG. 13B, the resistive defect manager 1220 updates the bad block table to include addresses of the strings STR3 and STR4 of the memory block BLK2 connected with the second ground selection line GSL2 with the resistive defect. In this case, data stored in the strings STR3 and STR4 of the memory block BLK2 may be stored in (or copied back to) any other memory block; afterwards, the access to the strings STR3 and STR4 of the memory block BLK2 may be blocked. However, the program operation may be continuously performed on the strings STR1 and STR2 of the memory block BLK2, which are not connected with the second ground selection line GSL2. Because only the strings STR3 and STR4 corresponding to the row line with the resistive defect are not used any longer, the strings STR3 and STR4 may be called bad strings. In other words, the strings STR3 and STR4 may be marked invalid in the bad block table. As the resistive defect is managed for each string in the bad block table, normal strings may be continuously available (e.g., those strings marked valid), and thus, a storage space may be efficiently managed.

Figure 14:
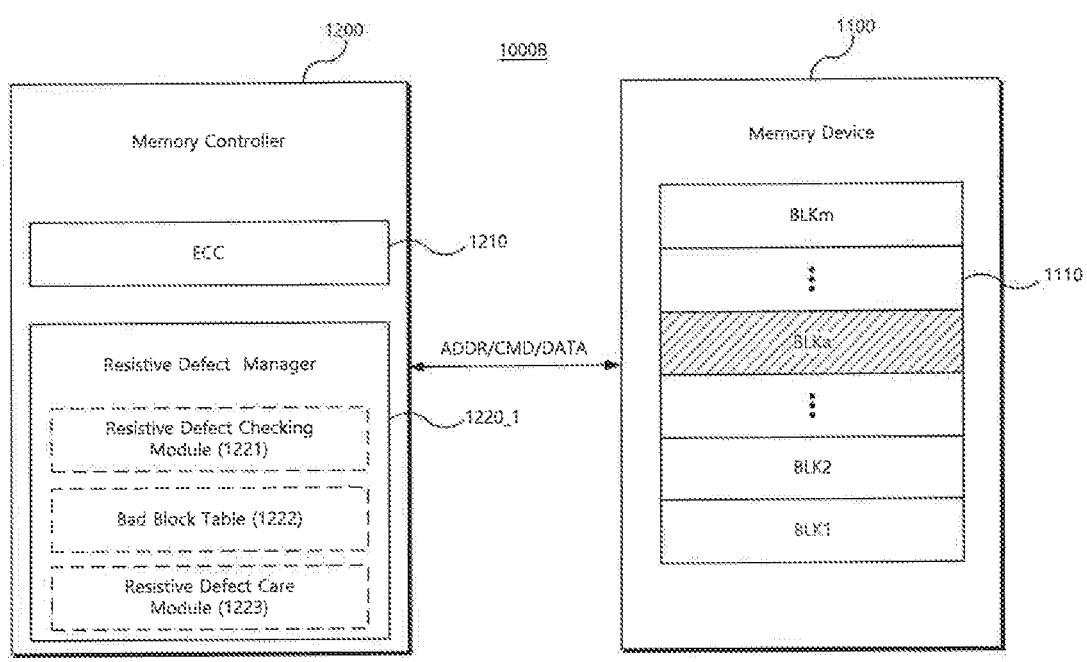
FIG. 14 is a block diagram illustrating an example of a data storage device 1000B according to another embodiment of the present disclosure.

FIG. 14 is a block diagram illustrating an example of a data storage device 1000B according to another embodiment of the present disclosure. The data storage device 1000B of FIG. 14 is similar to the data storage device 1000A of FIG. 1. Accordingly, the same or similar components may be marked by the same or similar reference numerals/signs, and additional description associated with the same or similar components will be omitted to avoid redundancy.

The data storage device 1000B of FIG. 14 further provides a resistive defect care operation. Herein, the resistive defect care operation refers to an operation of adjusting a program operation time of a memory block including a row line with the resistive defect so that the memory block can be continuously used, instead of processing the memory block as a bad block. To accomplish this, a resistive defect manager 1220_1 may further include a resistive defect care module 1223.

The resistive defect care module 1223 adjusts the program operation time of the memory block including the row line with the resistive defect. For example, the resistive defect care module 1223 may increase the recovery time margin that belongs to the program operation time of the memory block including the row line with the resistive defect. As the recovery time margin is increased to such an extent that a voltage level of the row line with the resistive defect sufficiently transitions to the low level, the program operation may be normally performed on the memory block including the row line with the resistive defect. This way, the number of bad blocks can be reduced and efficiently managed.

Figure 15:
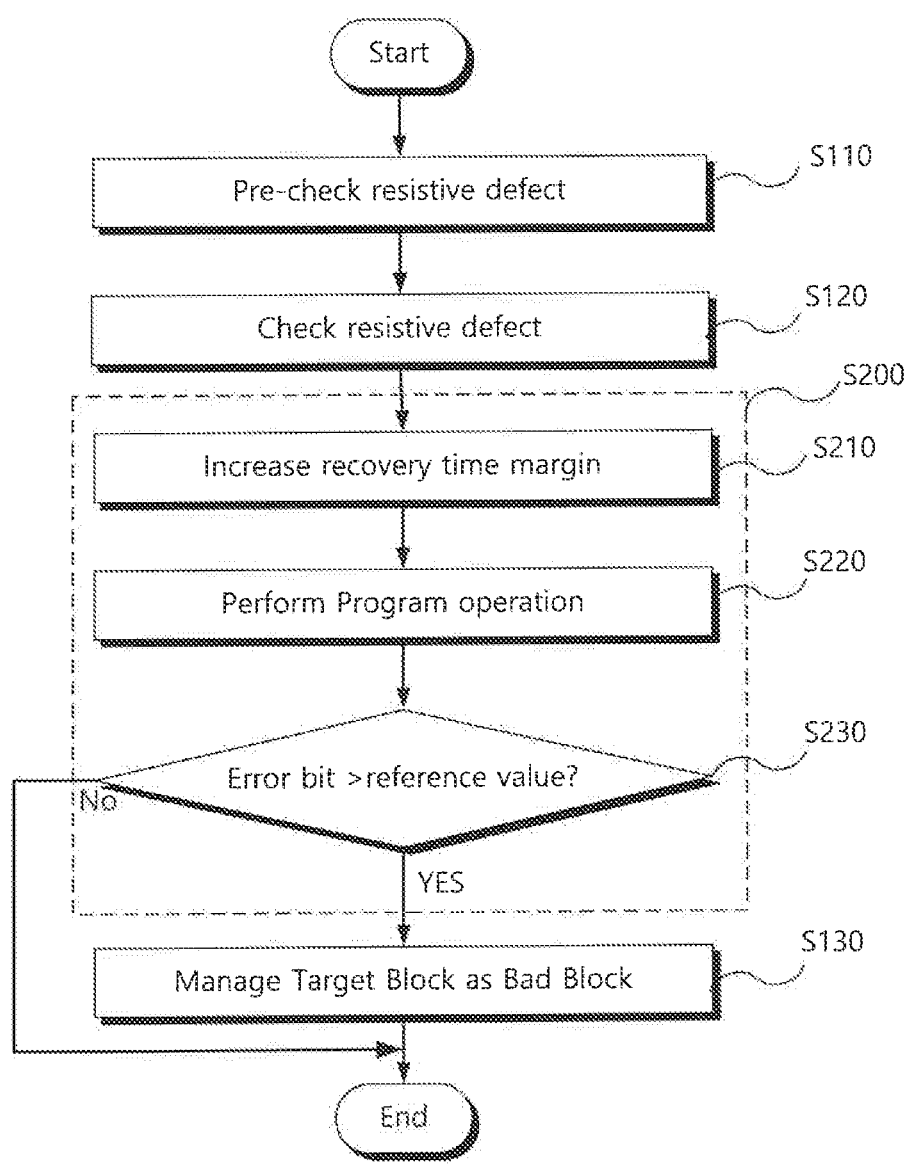
FIGS. 15, 16A, and 16B are diagrams for describing an example of the resistive defect care operation of the resistive defect manager 1220_1 of FIG. 14.
Figure 16A:
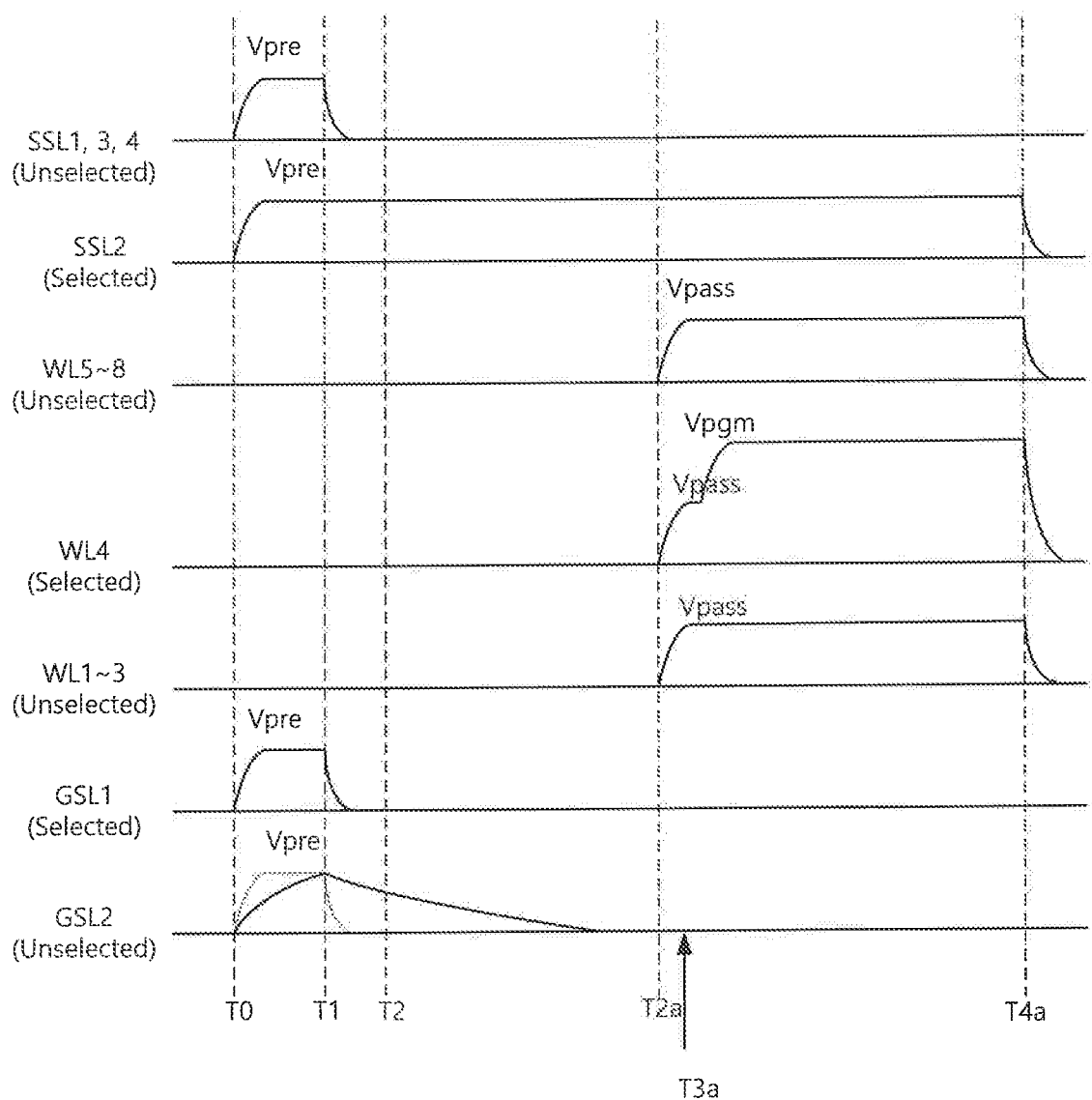
Figure 16B:
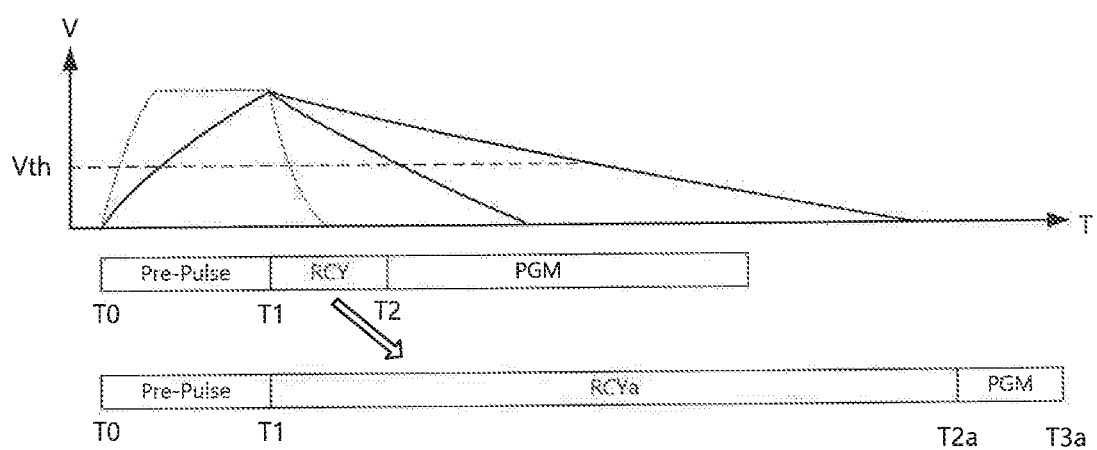

FIGS. 15, 16A, and 16B are diagrams for describing an example of the resistive defect care operation of the resistive defect manager 1220_1 of FIG. 14. In detail, FIG. 15 is a flowchart illustrating the resistive defect care operation. FIG. 16A is a diagram illustrating an example of voltage levels that are provided to row lines in the resistive defect care operation. FIG. 16B is a diagram illustrating a voltage level of the ground selection line GSL with the resistive defect, in detail. For convenience of description, as in the description given with reference to FIG. 5A, the following description will be given under the assumption that the resistive defect occurs at the second ground selection line GSL2.

Referring to FIG. 15, in operation S110, the resistive defect pre-check operation is performed. When it is determined that the probability that the resistive defect occurs at a row line except for word lines is high, the resistive defect check operation is performed (S120). When it is determined that the resistive defect occurs at the row line except for the word lines, the resistive defect care operation is performed (S200).

In detail, in operation S210, the recovery time margin is increased. For example, as illustrated in FIG. 16A, the recovery time margin may increase until the ground selection transistor connected with the second ground selection line GSL2 is sufficiently turned off, compared to the case described with reference to FIG. 5A. For example, when the resistive defect care operation is performed, the recovery time margin may increase to a time period from T1 to T2a, as illustrated in FIG. 16A.

In operation S220, the program operation is performed in a state where the recovery time margin increases. In other words, the program operation is performed when the voltage of the second ground selection line GSL2 is effectively zero.

For example, referring to FIG. 16A, at a point in time T0, the pre-pulse voltage Vpre is provided to the unselected string selection lines string selection line SSL1, SSL3, and SSL4, the selected string selection line SSL2 and the ground selection lines GSL1 and GSL2. At a point in time T1, the ground (GND) voltage is provided to the unselected string selection lines SSL1, SSL3, and SSL4 and the ground selection lines GSL1 and GSL2; during the time period from T1 to T2a, the unselected string selection lines SSL1, SSL3, and SSL4 and the ground selection lines GSL1 and GSL2 are recovered. It is to be understood that the unselected string selection lines SSL1, SSL3, and SSL4 and the ground selection line GSL1 are recovered prior to the point in time T2, but the ground selection line GSL2 takes until the point in time T2a to be recovered. Afterwards, at the point in time T2a, the pass voltage Vpass is provided to the unselected word lines WL1 to WL3 and WL5 to WL8. The pass voltage Vpass and the program voltage Vpgm are sequentially provided to the selected word line, in other words, the fourth word line WL4.

In this case, referring to FIG. 16B, because the recovery time margin sufficiently increases to the time period from T1 to T2a, the voltage level of the second ground selection line GSL2 is set to the ground level at the point in time T2a. Accordingly, the ground selection transistor connected with the second ground selection line GSL2 is turned off. In addition, because the voltage level of the third and fourth string selection lines SSL3 and SSL4 is also set to the ground level at the point in time T2a, the string selection transistors connected with the third and fourth string selection lines SSL3 and SSL4 are also turned off. Accordingly, the channels of the third and fourth strings STR3 and STR4 may be floated and may be boosted when the program voltage Vpgm is provided through the fourth word line WL4. As a result, the program operation may be normally performed on the memory block including the second ground selection line GSL2 with the resistive defect.

Returning to FIG. 15, in operation S230, whether the number of error bits is more than a reference value is determined. Herein, the reference value may refer to a value that is smaller than the number of error bits, occurring before the recovery time margin increases, as much as a given value.

When the number of error bits is more than a reference value, the resistive defect manager 1220_1 determines that it is impossible to work with the resistive defect occurring at the row line and manages a memory block including the row line with the resistive defect as a bad block (S130). When the number of error bits is less than or equal to the reference value, the resistive defect manager 1220_1 determines that it is possible to work with the resistive defect occurring at the row line and maintains a state where the recovery time of the memory block including the row line with the resistive defect is increased.

As described above, the data storage device 1000B according to an embodiment of the present disclosure may continuously use the memory block including the row line with the resistive defect through the resistive defect care operation.

It is to be understood that the description is given above as the resistive defect occurs at the ground selection line GSL of row lines except for word lines. However, this is merely an example, and the present disclosure is not limited thereto. For example, the resistive defect may occur at any other row line except for the ground selection line, and the embodiments of the present disclosure described with reference to FIGS. 1 to 16 may be applied to the resistive defect that occurs at any other row line except for the ground selection line. Below, the case where the resistive defect occurs at any other row line except for the ground selection line, for example, at a string selection line will be described in detail.

Figure 17A:
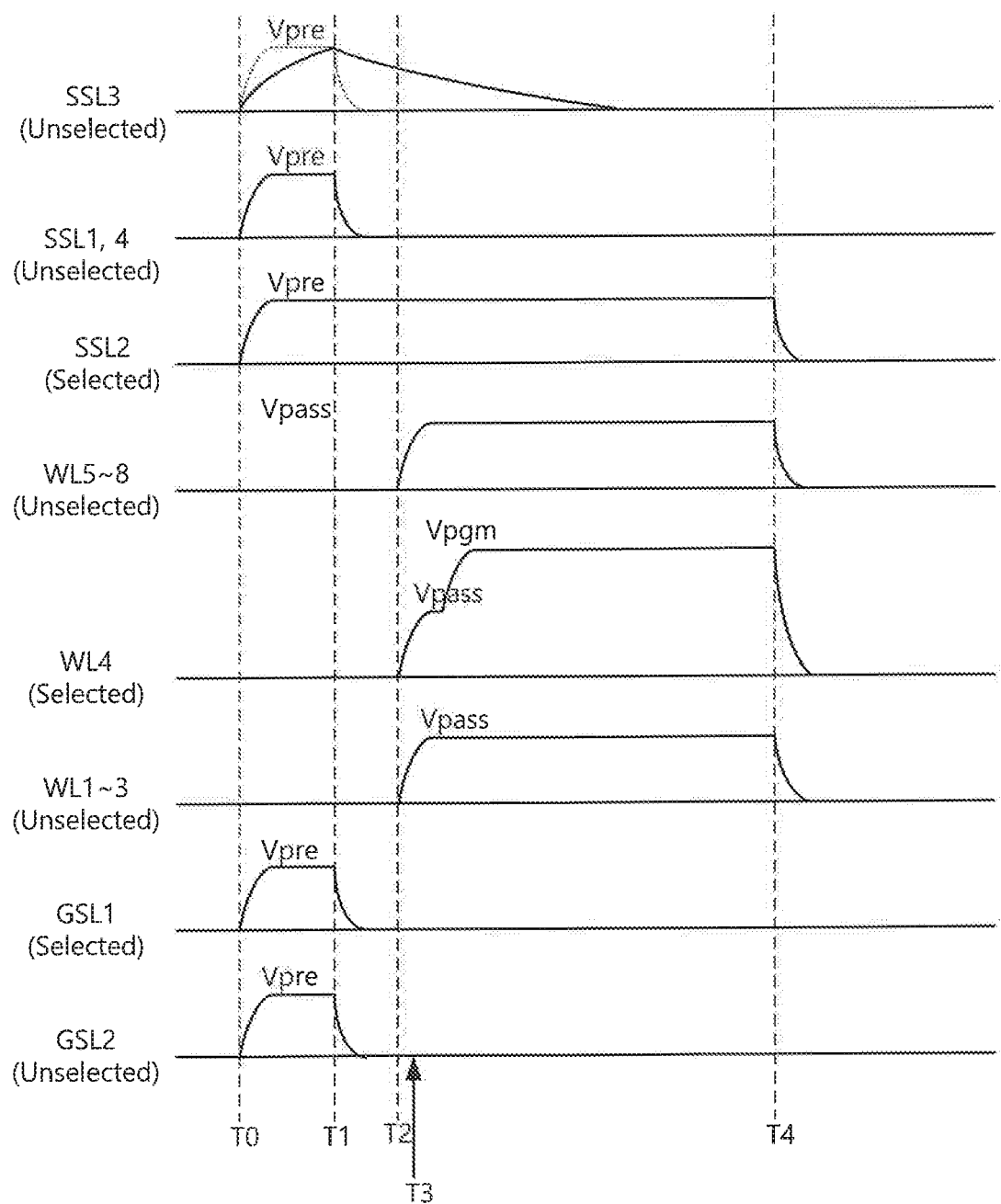
FIGS. 17A and 17B are diagrams for describing an example of the case where the resistive defect occurs at a string selection line.
Figure 17B:
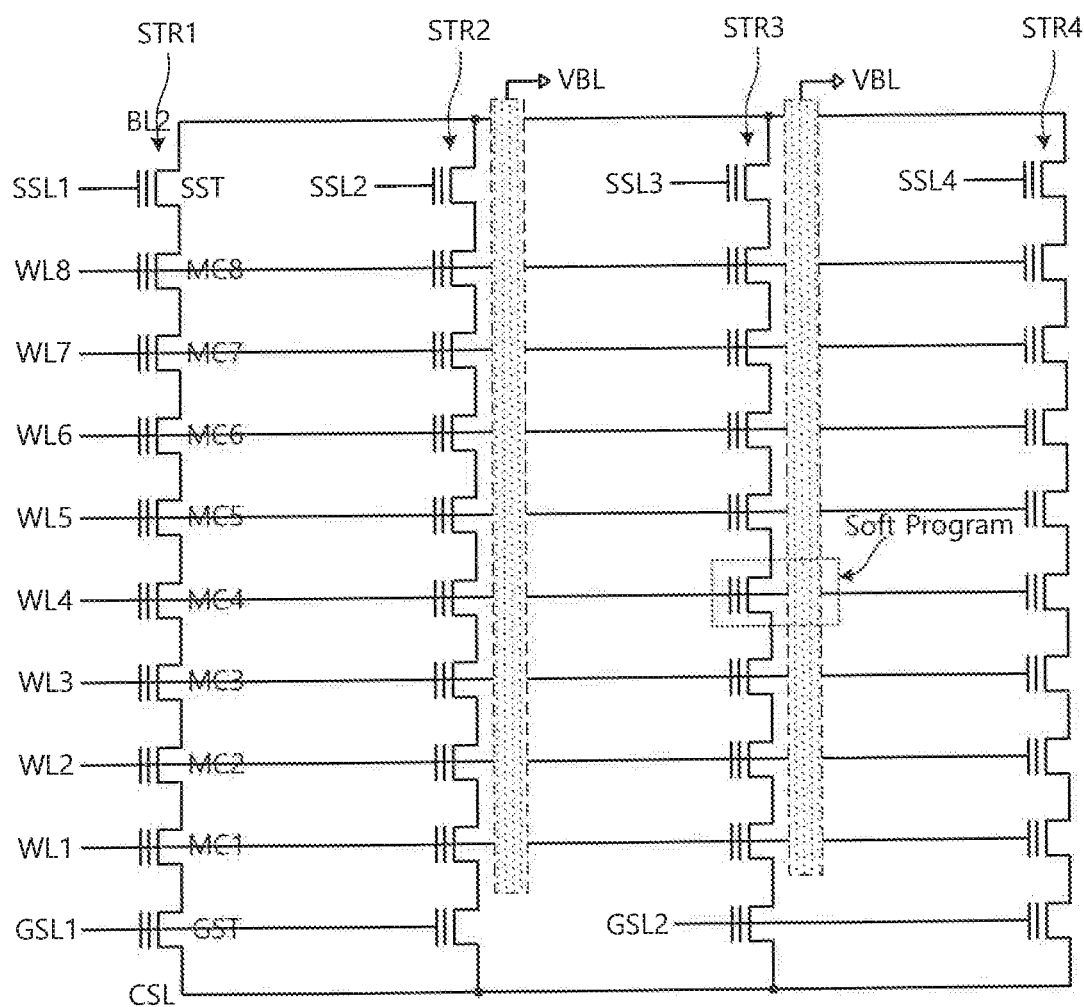

FIGS. 17A and 17B are diagrams for describing an example of the case where the resistive defect occurs at a string selection line. For convenience of description, it is assumed that the resistive defect occurs at the third string selection line SSL3. An example of voltage levels that are provided to row lines when the program operation is performed in a state where the resistive defect occurs at the third string selection line SSL3 is illustrated in FIG. 17A. An example of channels formed in the second string STR2 and the third string STR3 at a point in time T3 of FIG. 17A is illustrated in FIG. 17B. The examples of the voltage levels of FIG. 17A and the channels of FIG. 17B are similar to the examples of the voltage levels of FIG. 5A and the channels of FIG. 5B, and thus, additional description will be omitted to avoid redundancy.

Referring to FIG. 17A, the voltage level of the third string selection line SSL3 with the resistive defect transitions slowly compared to the other unselected string selection lines SSL1 and SSL4. In this case, the string selection transistor connected with the third string selection line SSL3 may maintain the turn-on state at the point in time T3.

In this case, as illustrated in FIG. 17B, because the string selection transistor SST connected with the third string selection line SSL3 is in the turn-on state, an upper end of the unselected string STR3, in other words, the third string STR3 is not separated from the second bit line BL2. In other words, the channel formed in the third string STR3 that is unselected is connected with the second bit line BL2, not floated.

When the program voltage Vpgm is applied through the fourth word line WL4 under the above condition, the hot carrier injection (HCI) occurs due to a voltage difference between the program voltage Vpgm and a voltage of the channel formed in the third string STR3 that is unselected; in this case, a memory cell of the third string STR3 that is unselected is soft programmed.

In an embodiment of the present disclosure, the resistive defect occurring at the string selection line may be checked through the resistive defect pre-check operation and the resistive defect check operation. Accordingly, even in the case where the string selection line has the resistive defect, the read latency may be prevented from being increased due to the resistive defect, and the probability that the UECC data occur may decrease.

In addition, in an embodiment of the present disclosure, the above resistive defect care operation may be performed on a memory block corresponding to the string selection line with the resistive defect. Accordingly, the memory block corresponding to the string selection line with the resistive defect may be continuously used normally.

Figure 18:
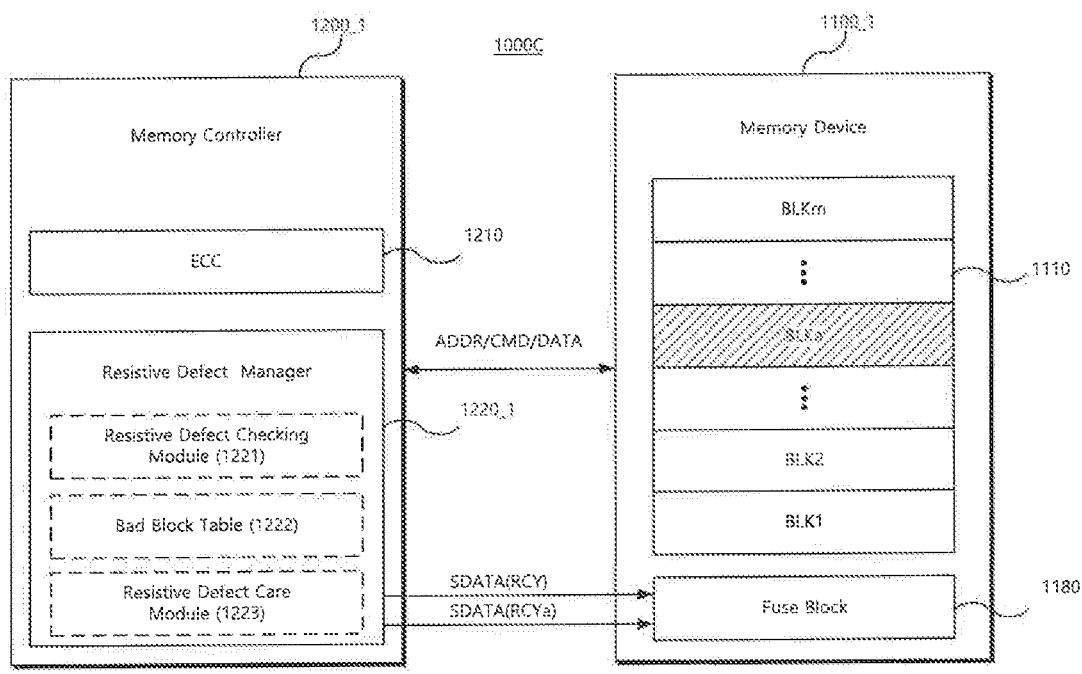
FIG. 18 is a block diagram illustrating an example of a data storage device 1000C according to another embodiment of the present disclosure.

FIG. 18 is a block diagram illustrating an example of a data storage device 1000C according to another embodiment of the present disclosure. The data storage device 1000C of FIG. 18 is similar to the data storage device 1000A of FIG. 14. Accordingly, the same or similar components may be marked by the same or similar reference numerals/signs, and additional description associated with the same or similar components will be omitted to avoid redundancy.

Referring to FIG. 18, a memory controller 1200_1 may provide a memory device 1100_1 with information about a program operation time including a recovery time margin RCY by using special data SDATA. Herein, the special data SDATA may refer to data that are incapable of being arbitrarily changed by the user once stored in the memory device 1100_1. For example, the special data SDATA may include secure data associated with the memory device 1100_1, data about the product specification of the memory device 1100_1, and/or setting data necessary for an operation of the memory device 1100_1.

At least one of the memory blocks BLK1 to BLKm of the memory device 1100_1 may be a one-time programmable (OTP) block. The memory device 1100_1 may store the recovery time margin RCY received from the memory controller 1200_1 in the OTP block.

In an embodiment of the present disclosure, in the case where the recovery time margin RCY is adjusted by the resistive defect care operation, the memory controller 1200_1 may again provide the memory device 1100_1 with information about a changed recovery time margin RCYa by using the special data SDATA.

The memory device 1100_1 may store the changed recovery time margin RCYa received from the memory controller 1200_1 in the OTP block. As such, both the recovery time margin RCY and the changed recovery time margin RCYa may be stored in the OTP block. The recovery time margin RCY refers to setting data associated with the program operation of the normal memory block, and the changed recovery time margin RCYa refers to setting data associated with the program operation of a memory block including a row line with the resistive defect. As described above, the changed recovery time margin RCYa may be set to be longer than the recovery time margin RCY.

The memory device 1100_1 may further include a fuse block 1180. The fuse block 1180 may be connected with the page buffer circuit 1140 (refer to FIG. 2), and may be used to process data stored in the OTP block of the memory cell array 1110 in an electrical fuse manner, for example.

The control logic 1170 (refer to FIG. 2) may independently control the program operation for the normal memory block and the program operation for the memory block including the row line with the resistive defect, based on the information about the recovery time margin RCY and the changed recovery time margin RCYa. Because the changed recovery time margin RCYa is set to be longer than the recovery time margin RCY, a time taken to perform the program operation on the memory block including the row line with the resistive defect may be longer than a time taken to perform the program operation on the normal memory block.

The above contents are detailed embodiments for carrying out the invention, and the present disclosure is not limited thereto. For example, in FIGS. 6 to 10B, the description is given as the resistive defect pre-check operation is performed and the resistive defect check operation is then performed. However, this is merely an example. For example, in an embodiment, only the resistive defect check operation may be performed in a state where the resistive defect pre-check operation may be omitted.

A data storage device according to an embodiment of the present disclosure checks whether the resistive defect occurs at a row line except for a word line and manages, as a bad block, a memory block connected with the row line where the resistive defect occurs. Accordingly, the read latency may be prevented from being increased due to the resistive defect, and the reliability of data may be increased.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A data storage device, comprising:
a memory device including a plurality of memory blocks; and
a memory controller configured to control the memory device,
wherein the plurality of memory blocks are connected with row lines, wherein the row lines include word lines,
wherein the memory controller is further configured to:
check whether a resistive defect occurs at the row lines except for the word lines; and
set a program operation time of a memory block corresponding to a row line, at which the resistive defect occurs, to be longer than a program operation time of the other memory blocks.

2. The data storage device of claim 1, wherein a recovery time margin of the memory block corresponding to the row line where the resistive defect occurs is longer than a recovery time margin of the other memory blocks.

3. The data storage device of claim 1, wherein the memory controller performs a resistive defect pre-check operation to check whether the resistive defect occurs at the row lines except for the word lines, and
wherein the resistive defect pre-check operation is performed based on a number of error bits, a degree of disturb of threshold voltages of memory cells included in an unselected string, a correction level of a recovery code algorithm, or a row line voltage level distribution.

4. The data storage device of claim 3, wherein the memory controller performs a resistive defect check operation to further check whether the resistive defect occurs at the row lines except for the word lines, and
wherein the resistive defect check operation is performed by adjusting a recovery time margin of a program operation for a row line, which is determined by the resistive defect pre-check operation as having a high probability of occurrence of the resistive defect.

5. The data storage device of claim 4, wherein the memory controller sets the recovery time margin of the program operation for the row line, which is determined by the resistive defect pre-check operation as having the high probability of occurrence of the resistive defect to be shorter than a recovery time margin of the other memory blocks.

6. The data storage device of claim 1, further comprising performing a program operation on the memory block corresponding to the row line at which the resistive defect occurs.

7. The data storage device of claim 6, wherein the memory controller manages, as a bad block, the memory block corresponding to the row line where the resistive defect occurs, based on a number of error bits due to the program operation.

8. The data storage device of claim 6, wherein the memory controller manages, as a bad string, strings corresponding to the row line where the resistive defect occurs, based on a number of error bits due to the program operation.

9. A data storage device, comprising:
a memory device including a plurality of memory blocks; and
a memory controller configured to control the memory device,
wherein the plurality of memory blocks are connected with row lines, wherein the row lines include word lines,
wherein the memory controller is further configured to:
check whether a resistive defect occurs at the row lines other than the word lines; and
manage a memory block corresponding to a row line, at which the resistive defect occurs, as a bad block,
wherein the memory controller includes:
a resistive defect manager configured to check whether the resistive defect occurs at the row lines other than the word lines, and
wherein the resistive defect manager checks the probability that the resistive defect occurs at the row lines other than the word lines, based on a number of error bits, a degree of disturb of threshold voltages of memory cells included in an unselected string a correction level of a recovery code algorithm, or a row line voltage level distribution.

10. The data storage device of claim 9, wherein the resistive defect manager further checks the probability that the resistive defect occurs at the row lines other than the word lines, by adjusting a recovery time margin of a program operation for a row line determined to have a high probability of occurrence of the resistive defect.

11. The data storage device of claim 10, wherein the resistive defect manager further checks the probability of occurrence of the resistive defect by shortening the recovery time margin.

12. The data storage device of claim 9, wherein the memory controller includes a bad block table, and
wherein the bad block table stores the memory block corresponding to the row line, at which the resistive defect occurs.

13. The data storage device of claim 9, wherein the memory controller includes a bad block table, and
wherein the bad block table stores address information about a string corresponding to the row line, at which the resistive defect occurs.

14. A data storage device, comprising:
a memory device including a plurality of memory blocks; and
a memory controller,
wherein the plurality of memory blocks are connected with row lines that include word lines,
wherein the memory controller checks whether a resistive defect occurs at the row lines except for the word lines by setting a program operation time of a memory block selected from the plurality of memory blocks to be shorter than a program operation time of the other memory blocks.

15. The data storage device of claim 14, wherein the memory controller sets a recovery time margin for the selected memory block to be shorter than a recovery time margin of the other memory blocks.

16. The data storage device of claim 14, wherein, before the program operation time of the selected memory block is set to be shorter than the program operation time of the other memory blocks, the memory controller pre-checks whether the resistive defect occurs at the row line corresponding to the selected memory block, by comparing the number of error bits detected from the selected memory block with the number of error bits detected from the other memory blocks.

17. The data storage device of claim 14, wherein, before the program operation time of the selected memory block is set to be shorter than the program operation time of the other memory blocks, the memory controller pre-checks whether the resistive defect occurs at the row line corresponding to the selected memory block, based on a threshold voltage increment of memory cells included in an unselected string belonging to the selected memory block.

18. The data storage device of claim 14, wherein, before the program operation time of the selected memory block is set to be shorter than the program operation time of the other memory blocks, the memory controller pre-checks whether the resistive defect occurs at the row line corresponding to the selected memory block, based on a correction level of a recovery code algorithm corresponding to the selected memory block.

19. The data storage device of claim 14, wherein, before the program operation time of the selected memory block is set to be shorter than the program operation time of the other memory blocks, the memory controller pre-checks whether the resistive defect occurs at the row line corresponding to the selected memory block, based on a voltage level distribution of the row line corresponding to the selected memory block.

* * * * *